(12) United States Patent
Gulstone et al.

(10) Patent No.: US 10,990,627 B1
(45) Date of Patent: Apr. 27, 2021

(54) SHARING CHARACTER DATA ACROSS LOOKUPS TO IDENTIFY MATCHES TO A REGULAR EXPRESSION

(71) Applicant: Amazon Technologies, Inc., Seattle, WA (US)

(72) Inventors: Nigel Antoine Gulstone, San Jose, CA (US); Kiran Kalunte Seshadri, Cedar Park, TX (US)

(73) Assignee: Amazon Technologies, Inc., Seattle, WA (US)

( * ) Notice: Subject to any disclaimer, the term of this patent is extended or adjusted under 35 U.S.C. 154(b) by 55 days.

(21) Appl. No.: 16/216,536

(22) Filed: Dec. 11, 2018

(51) Int. Cl.
| | |
|---|---|
| *G06F 16/903* | (2019.01) |
| *G06F 16/9035* | (2019.01) |
| *G06F 30/327* | (2020.01) |
| *G06F 30/34* | (2020.01) |

(52) U.S. Cl.
CPC .... *G06F 16/90344* (2019.01); *G06F 16/9035* (2019.01); *G06F 30/327* (2020.01); *G06F 30/34* (2020.01); *G06F 2212/00* (2013.01)

(58) Field of Classification Search
CPC .. G06F 30/327; G06F 30/34; G06F 16/90344; G06F 16/24568; G06F 16/2462; G06F 16/9035; G06F 16/2468; G06F 15/7867; G06F 2207/025; G06F 2207/583; G06F 7/584
See application file for complete search history.

(56) References Cited

U.S. PATENT DOCUMENTS

| | | | | | |
|---|---|---|---|---|---|
| 7,093,023 | B2* | 8/2006 | Lockwood | ............. | H04L 41/08 709/231 |
| 7,180,895 | B2* | 2/2007 | Smith | .................... | H04L 47/10 370/394 |
| 7,356,663 | B2* | 4/2008 | Jain | .................... | H04L 63/1408 711/122 |
| 7,529,746 | B2* | 5/2009 | Ichiriu | ............. | G06F 16/90344 |
| 7,539,031 | B2* | 5/2009 | Ninan | ............... | G06F 16/90344 365/49.1 |
| 7,539,032 | B2* | 5/2009 | Ichiriu | ............. | G06F 16/90344 365/49.17 |
| 7,624,105 | B2* | 11/2009 | Ichiriu | .................. | G06F 16/951 |
| 7,644,080 | B2* | 1/2010 | Mammen | .......... | G06F 16/24568 707/713 |

(Continued)

OTHER PUBLICATIONS

Yang et al.; "High-Performance and Compact Architecture for Regular Expression Matching on FPGA"; IEEE Transactions on Computers; vol. 61, Issue: 7; Journal Article; Publisher: IEEE (Year: 2012).*

(Continued)

*Primary Examiner* — Helen Rossoshek
(74) *Attorney, Agent, or Firm* — Robert C. Kowert; Kowert, Hood, Munyon, Rankin & Goetzel, P.C.

(57) ABSTRACT

Integrated circuits may implement a filter to identify items in a data store that match a regular expression by sharing character data across lookups in the filter. The NFA states of the may be programmed responsive to a query that includes a regular expression. The NFA states may include a character decode stage that operates on one portion of character bits, while another portion of character bits is evaluated at a state detection stage that also evaluates an output value of the character decode stage.

20 Claims, 11 Drawing Sheets

(56) References Cited

U.S. PATENT DOCUMENTS

| | | | | |
|---|---|---|---|---|
| 7,916,510 | B1* | 3/2011 | Starovoitov | G06F 16/90344 365/49.1 |
| 9,507,563 | B2* | 11/2016 | Billa | G06F 9/3885 |
| 9,665,664 | B2* | 5/2017 | Ruehle | G06F 16/90344 |
| 2016/0171102 | A1* | 6/2016 | Pandya | G06F 16/90344 707/712 |
| 2016/0267142 | A1* | 9/2016 | Cafarella | G06F 16/90344 |
| 2017/0083288 | A1* | 3/2017 | Wadden | G06F 7/584 |
| 2017/0103333 | A1* | 4/2017 | Guo | G06F 5/01 |
| 2017/0168962 | A1* | 6/2017 | Pandya | H04L 63/145 |

OTHER PUBLICATIONS

Graves et al.; "Regular Expression Matching with Memristor TCAMs for Network Security"; 2018 IEEE/ACM International Symposium on Nanoscale Architectures (NANOARCH); | Conference Paper | Publisher: IEEE (Year: 2018).*
David Sidler et al, "Accelerating Pattern Matching Queries in Hybrid CPU-FPGA Architectures", dated May 14-19, 2017, pp. 1-13.
Louis Woods et al, "Complex Event Detection at wire speed with FPGAs", (Proceedings of the VLDB Endowment, vol. 3, No. 1), 2010, pp. 1-10.
Reetinder Sidhu et al, "Fast Regular Expression Matching using FPGA's", (Department of EE-Systems, University of Southern California, Los Angeles CA 90089), pp. 1-12.
Yusaku Kaneta et al, "High-Speed String and Regular Expression Matching on FPGA", 2011, pp. 1-7.

* cited by examiner

SHARING CHARACTER DATA ACROSS LOOKUPS TO IDENTIFY MATCHES TO A REGULAR EXPRESSION

BACKGROUND

As the technological capacity for organizations to create, track, and retain information continues to grow, a variety of different technologies for querying data with increasing speed and efficiency continue to be developed. General purpose hardware, such as central processing units (CPUs) may execute various software applications, such as query engines for databases or other data processing platforms, and may offer many different query capabilities for searching data. While general purpose hardware offers the ability to deploy different software applications to perform queries in a variety of different contexts, performance of software applications may be limited to optimizing the design of the software applications to fit the character of the general purpose hardware. Operations performed upon dedicated circuitry, however, can optimize performance of the hardware to performance of specific operations for querying data which can achieve performance gains beyond those achievable by software applications alone.

While embodiments are described herein by way of example for several embodiments and illustrative drawings, those skilled in the art will recognize that embodiments are not limited to the embodiments or drawings described. It should be understood, that the drawings and detailed description thereto are not intended to limit embodiments to the particular form disclosed, but on the contrary, the intention is to cover all modifications, equivalents and alternatives falling within the spirit and scope as defined by the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include," "including," and "includes" mean including, but not limited to.

It will also be understood that, although the terms first, second, etc. may be used herein to describe various elements, these elements should not be limited by these terms. These terms are only used to distinguish one element from another. For example, a first contact could be termed a second contact, and, similarly, a second contact could be termed a first contact, without departing from the scope of the present invention. The first contact and the second contact are both contacts, but they are not the same contact.

DETAILED DESCRIPTION OF EMBODIMENTS

Various embodiments of sharing character data across lookups to identify matches to a regular expression are described herein. Regular expressions may, in various embodiments, provide a search pattern for identifying items in a data store (e.g., tuples, entries, rows, fields or column values, etc.) which match the pattern identified by a regular expression. Support for regular expressions can increase the flexibility and scope of queries to a data store. For example, regular expressions could be used to find data in one query that might otherwise have to be found by executing multiple queries without regular expressions.

Figure 1:
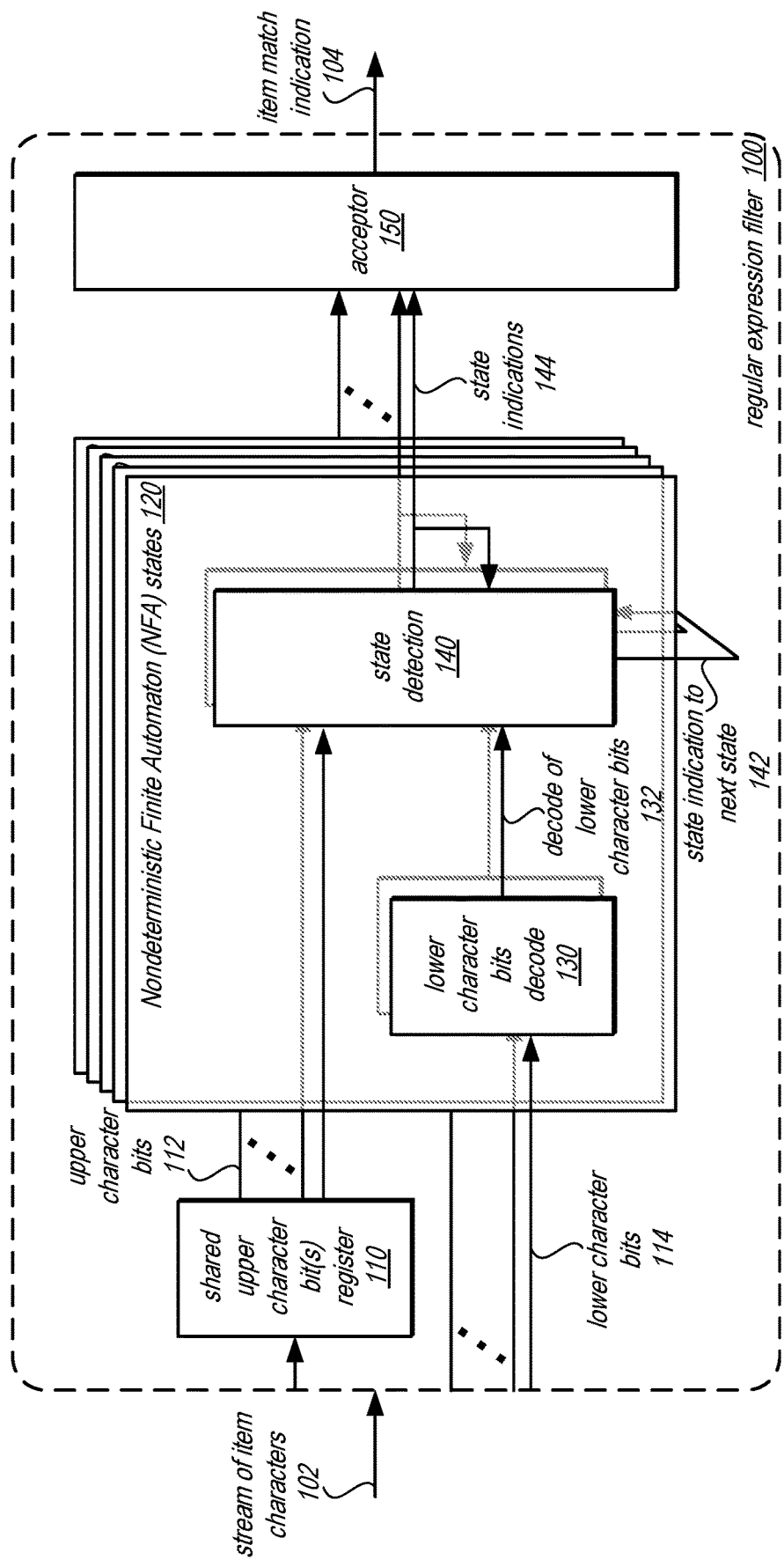
FIG. 1 is a logical block diagram of sharing character data across lookups to identify matches to a regular expression, according to some embodiments.

Hardware optimized techniques may be implemented, in various embodiments, to perform regular expression matching when querying a data store. Integrated circuitry, such as a Field Programmable Gate Array (FPGA), Application Specific Integrated Circuit (ASIC), or a System-on-a-CHIP (SoC), etc., may implement hardware components (e.g., flops or other registers, lookup tables, etc.) dedicated to evaluating whether an input item of a data store matches the regular expression. When considering the design of performing regular expression matching in hardware, area, power, and support (e.g., supported features in FPGAs for example) may offer a design challenge to achieve regular expression filtering within such design considerations. Sharing character data across different lookups to identify matches offers a flexible design that can optimize efficient utilization of hardware resources to satisfy area, power and/or support considerations For example, instead of designing custom lookup tables to implement lookup tables for decoding character data in different nondeterministic finite automaton (NFA) states implemented to identify a match to a regular expression, sharing character data across lookups (e.g., from a common register) may reduce the size and complexity of regular expression filter design so that supported lookup tables (e.g., supported lookup tables of an FPGA) can be used, in some embodiments. FIG. 1 is a logical block diagram of sharing character data across lookups to identify matches to a regular expression, according to some embodiments.

Regular expression filter 100 may be implemented on dedicated circuitry like an FPGA, ASIC, as part of an SOC, or other hardware component, in various embodiments. Regular expression filter 100 may take as input a stream of characters 102 from an item (e.g., tuple) to be evaluated one at a time and process the stream of characters through regular expression filter 100 so that when a last character of an item is evaluated at regular expression filter 100, an item match indication 104 may be provided by regular expression filer 100.

Regular expression filter 100 may include a number nondeterministic finite automaton (NFA) states 120 which may be programmable to identify a match of regular expressions of varying lengths, as not all NFA states 120 need be utilized for every regular expression evaluated by regular expression filter 100. NFA states 120 may be determined for a regular expression by transforming a text string or indication of a regular expression into an NFA, which may include multiple states 120 to be evaluated by regular expression filter 120. NFA states 120 may each include a lower character bits decode stage 130 and a state selection stage 140. The output of these stages 130 (and in some cases other inputs) may be used to identify whether an NFA state is matched. One or more combinations of matching NFA states 120 provided in state indications 144 to acceptor 150, which may then identify whether or not the item matches the regular expression after all characters in the item have been evaluated.

Lower character bits decode stage 130 may receive a portion of a bit representation of a character (e.g., 5 bits) that are lower character bits 114 (e.g., the portion of bits including the least significant bit) and perform a lookup to determine whether that character corresponds to a matching state of NFA state 120 (which could be one or multiple different characters as one or multiple different characters could satisfy that NFA state). The decode of lower character bits 132 may then be used as part of a lookup at state detection stage 140. Additionally, the remaining upper character bit(s) may be stored in a register 110 and then provided 112 to state detection 140 as part of the lookup for the character being evaluated at state detection 140. In some embodiments other inputs such as a state indication to a next state 142 may also be used to perform a lookup, as well as the output of a previous character at state detection stage 140 (as indicated by the back arrow of state indications 144). The output of the lookup at state detection stage 140 may then be provided as state indications 144 to acceptor 150, which may ignore state indications 144 until a final character is evaluated, in some embodiments. Because character data, upper character bits 112 is shared across the lookups at state detection 140 across the multiple NFA states 120, hardware area may be conserved (because while the character decode stages 130 may be different for each NFA state, no such different component need be implemented to evaluate the remaining upper character bits 112. Other improvements, such as a character re-mapper may offer additional features, such as character classes for regular expression mapping, as discussed in detail below with regard to FIG. 8.

Please note that the previous description of sharing character data across lookups to identify matches to a regular expression is a logical illustration and thus is not to be construed as limiting as to the implementation of a shared upper character bits register, lower character bits decode stage, state detection stage, NFA state, or acceptor.

This specification begins with a general description of a provider network that implements multiple different services, including data processing services and a hardware accelerated data analytics service which may implement a regular expression filter that shares character data across lookups to identify matches to a regular expression. Then various examples of multiple data processors, such as a data warehouse service and a hardware accelerated data analytics service, including different components/modules, or arrangements of components/module that may be employed as part of implementing the data processors are discussed. A number of different methods and techniques to implement sharing character data across lookups in a regular expression filter to identify matches to a regular expression are then discussed, some of which are illustrated in accompanying flowcharts. Finally, a description of an example computing system upon which the various components, modules, systems, devices, and/or nodes may be implemented is provided. Various examples are provided throughout the specification.

Figure 2:
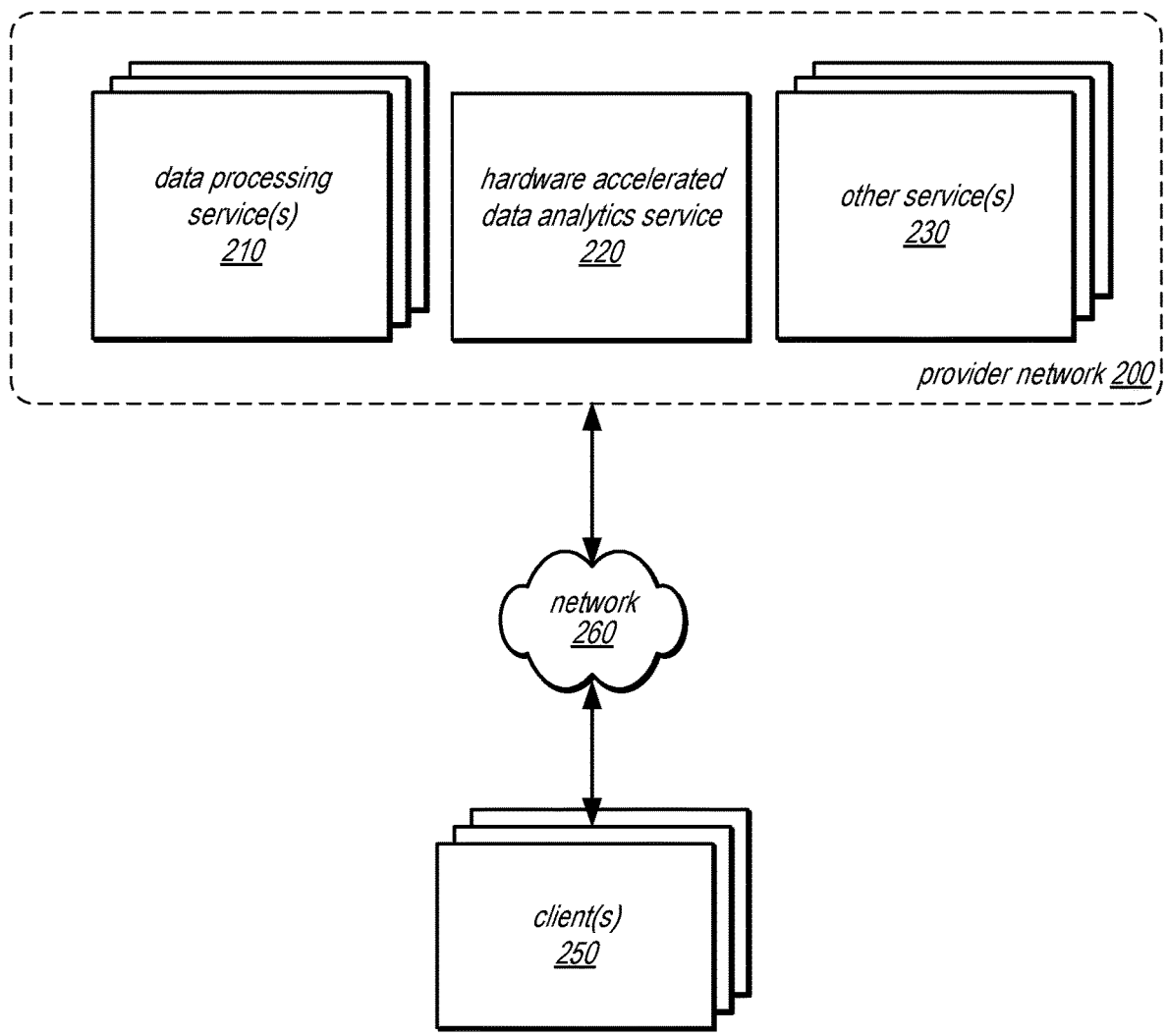
FIG. 2 is a logical block diagram illustrating a provider network offering data processing services that utilize a hardware accelerated data analytics service, according to some embodiments.

FIG. 2 is a logical block diagram illustrating a provider network offering data processing services that utilize a hardware accelerated data analytics service, according to some embodiments. Provider network 200 may be a private or closed system or may be set up by an entity such as a company or a public sector organization to provide one or more services (such as various types of cloud-based storage) accessible via the Internet and/or other networks to clients 250. Provider network 200 may be implemented in a single location or may include numerous data centers hosting various resource pools, such as collections of physical and/or virtualized computer servers, storage devices, networking equipment and the like (e.g., computing system 2000 described below with regard to FIG. 11), needed to implement and distribute the infrastructure and storage services offered by the provider network 200. In some embodiments, provider network 200 may implement various computing resources or services, such as data processing service(s) 210, (e.g., a map reduce service, a data warehouse service, and other large scale data processing services or database services), hardware accelerated data analytics service 220, and other services 230 that may be any other type of network based services (which may include a virtual compute service and various other types of storage, processing, analysis, communication, event handling, visualization, and security services).

In various embodiments, the components illustrated in FIG. 2 may be implemented directly within computer hardware, as instructions directly or indirectly executable by computer hardware (e.g., a microprocessor or computer system), dedicated circuitry, as discussed below with regard to FIGS. 4-10, or using a combination of these techniques. For example, the components of FIG. 2 may be implemented by a system that includes a number of computing nodes (or simply, nodes), each of which may be similar to the computer system embodiment illustrated in FIG. 11 and described below. In various embodiments, the functionality of a given system or service component (e.g., a component of data processing service 210, hardware accelerated data analytics service 220, or other service 230) may be implemented by a particular node or may be distributed across several nodes. In some embodiments, a given node may implement the functionality of more than one service system component (e.g., more than one data store component).

Data processing services 210 may be various types of data processing services that perform general or specialized data processing functions (e.g., anomaly detection, machine learning, data mining, big data querying, or any other type of data processing operation). For example, in at least some embodiments, data processing services 210 may include a map reduce service that creates clusters of processing nodes that implement map reduce functionality over data stored in the map reduce cluster as well as data stored in a data storage service (e.g. one of other service 230). In another example, data processing service(s) 210 may include various types of database services (both relational and non-relational) for storing, querying, and updating data. Such services may be enterprise-class database systems that are highly scalable and extensible.

Queries may be directed to data processing service(s) 210 that are distributed across multiple physical resources, and the database system may be scaled up or down on an as needed basis. The database system may work effectively with database schemas of various types and/or organizations, in different embodiments. In some embodiments, clients/subscribers may submit queries in a number of ways, e.g., interactively via an SQL interface to the database system. In other embodiments, external applications and programs may submit queries using Open Database Connectivity (ODBC) and/or Java Database Connectivity (JDBC) driver interfaces to the database system. For instance, data processing service(s) 210 may implement, in some embodiments, a data warehouse service, such as discussed below with regard to FIG. 3 that utilizes another data processing service, such as hardware accelerated data analytics service 220, to execute portions of queries or other access requests with respect to data (which may be stored in hardware accelerated dada analytics service 220 or in a remote data store, such as a provider network 200 data storage service (or a data store external to provider network 200).

Hardware accelerated data analytics service 220, as discussed in more detail below with regard to FIGS. 3-8, may provide a service supporting many data analytics operations implemented on dedicated circuitry, such as Field Programmable Gate Arrays (FPGAs), system-on-a-chip (SoC) or Application Specific Integrated Circuits (ASICs).

Hardware accelerated data analytics service 220 may perform requested operations, such as scan operations that filter out data results according to string or numeric value comparisons, aggregation operations that aggregate data values and provide partial or complete aggregation results, or other operations that organize or reduce the determined data results retrieved from storage using circuitry dedicated to and optimized for the performance such operations. For example, hardware accelerated data analytics service 220 may execute different operations that are part of a larger query plan generated at a data processing service 210 (such as discussed below with regard to FIG. 4 and provide results to the data processing service 210 by relying upon requests from data processing service(s) 210 to determine the different operations to perform. In this way, hardware accelerated data analytics service 220 may be implemented as a dynamically scalable and stateless analytics processing service that is fault tolerant without the need to support complex query planning and execution for multiple different analytics operations that can be performed faster and using less resources with hardware implementations of the analytics operations. Instead, hardware accelerated data analytics service 220 may offer a set of data processing capabilities to filter or otherwise retrieve data.

In some embodiments, other service(s) 230 may implement different types of data stores for storing, accessing, and managing data on behalf of clients 250 as a network-based service that enables clients 250 to operate a data storage system in a cloud or network computing environment. Data storage service(s) may also include various kinds of object or file data stores for putting, updating, and getting data objects or files. For example, one data storage service may be an object-based data store that allows for different data objects of different formats or types of data, such as structured data (e.g., database data stored in different database schemas), unstructured data (e.g., different types of documents or media content), or semi-structured data (e.g., different log files, human-readable data in different formats like JavaScript Object Notation (JSON) or Extensible Markup Language (XML)) to be stored and managed according to a key value or other unique identifier that identifies the object. In at least some embodiments, such data storage service(s) may be treated as a data lake. For example, an organization may generate many different kinds of data, stored in one or multiple collections of data objects in a data storage service. The data objects in the collection may include related or homogenous data objects, such as database partitions of sales data, as well as unrelated or heterogeneous data objects, such as audio files and web site log files. Data storage service(s) may be accessed via programmatic interfaces (e.g., APIs) or graphical user interfaces. For example, hardware accelerated data analytics service 220 may access data objects stored in data storage services via the programmatic interfaces (as discussed below with regard to FIG. 11).

Generally speaking, clients 250 may encompass any type of client that can submit network-based requests to provider network 200 via network 260, including requests for storage services (e.g., a request to query a data processing service 210, or a request to create, read, write, obtain, or modify data in data storage service(s), etc.). For example, a given client 250 may include a suitable version of a web browser, or may include a plug-in module or other type of code module that can execute as an extension to or within an execution environment provided by a web browser. Alternatively, a client 250 may encompass an application such as a database application (or user interface thereof), a media application, an office application or any other application that may make use of data processing service(s) 210, hardware accelerated data analytics service 220, or storage resources in data storage service(s) 230 to store and/or access the data to implement various applications. In some embodiments, such an application may include sufficient protocol support (e.g., for a suitable version of Hypertext Transfer Protocol (HTTP)) for generating and processing network-based services requests without necessarily implementing full browser support for all types of network-based data. That is, client 250 may be an application that can interact directly with provider network 200. In some embodiments, client 250 may generate network-based services requests according to a Representational State Transfer (REST)-style network-based services architecture, a document- or message-based network-based services architecture, or another suitable network-based services architecture.

In some embodiments, a client 250 may provide access to provider network 200 to other applications in a manner that is transparent to those applications. For example, client 250 may integrate with an operating system or file system to provide storage on one of data storage service(s) 230 (e.g., a block-based storage service). However, the operating system or file system may present a different storage interface to applications, such as a conventional file system hierarchy of files, directories and/or folders. In such an embodiment, applications may not need to be modified to make use of the storage system service model. Instead, the details of interfacing to the data storage service(s) 230 may be coordinated by client 250 and the operating system or file system on behalf of applications executing within the operating system environment. Similarly, a client 250 may be an analytics application that relies upon data processing service(s) 210 to execute various queries for data already ingested or stored in the data processing service (e.g., such as data maintained in a data warehouse service, like data warehouse service 300 in FIG. 3 below) or data stored in a data lake hosted in data storage service(s) by performing federated data processing between the data processing service 210 and hardware accelerated data analytics service 220 (as discussed below with regard to FIG. 5). In some embodiments, clients of data processing services 210, hardware accelerated data analytics service 220, and/or other service(s) 230 may be implemented within provider network 200 (e.g., an application hosted on a virtual computing resource that utilizes a data processing service 210 to perform database queries) to implement various application features or functions and thus various features of client(s) 250 discussed above may be applicable to such internal clients as well.

Clients 250 may convey network-based services requests (e.g., access requests to read or write data may be directed to data in data storage service(s) 230, operations, tasks, or jobs, being performed as part of data processing service(s) 220, or to interact with data catalog service 210) to and receive responses from provider network 200 via network 260. In various embodiments, network 260 may encompass any suitable combination of networking hardware and protocols necessary to establish network-based-based communications between clients 250 and provider network 200. For example, network 260 may generally encompass the various telecommunications networks and service providers that collectively implement the Internet. Network 260 may also include private networks such as local area networks (LANs) or wide area networks (WANs) as well as public or private wireless networks. For example, both a given client 250 and provider network 200 may be respectively provisioned within enterprises having their own internal networks. In such an embodiment, network 260 may include the hardware (e.g., modems, routers, switches, load balancers, proxy servers, etc.) and software (e.g., protocol stacks, accounting software, firewall/security software, etc.) necessary to establish a networking link between given client 250 and the Internet as well as between the Internet and provider network 200. It is noted that in some embodiments, clients 250 may communicate with provider network 200 using a private network rather than the public Internet.

Figure 3:
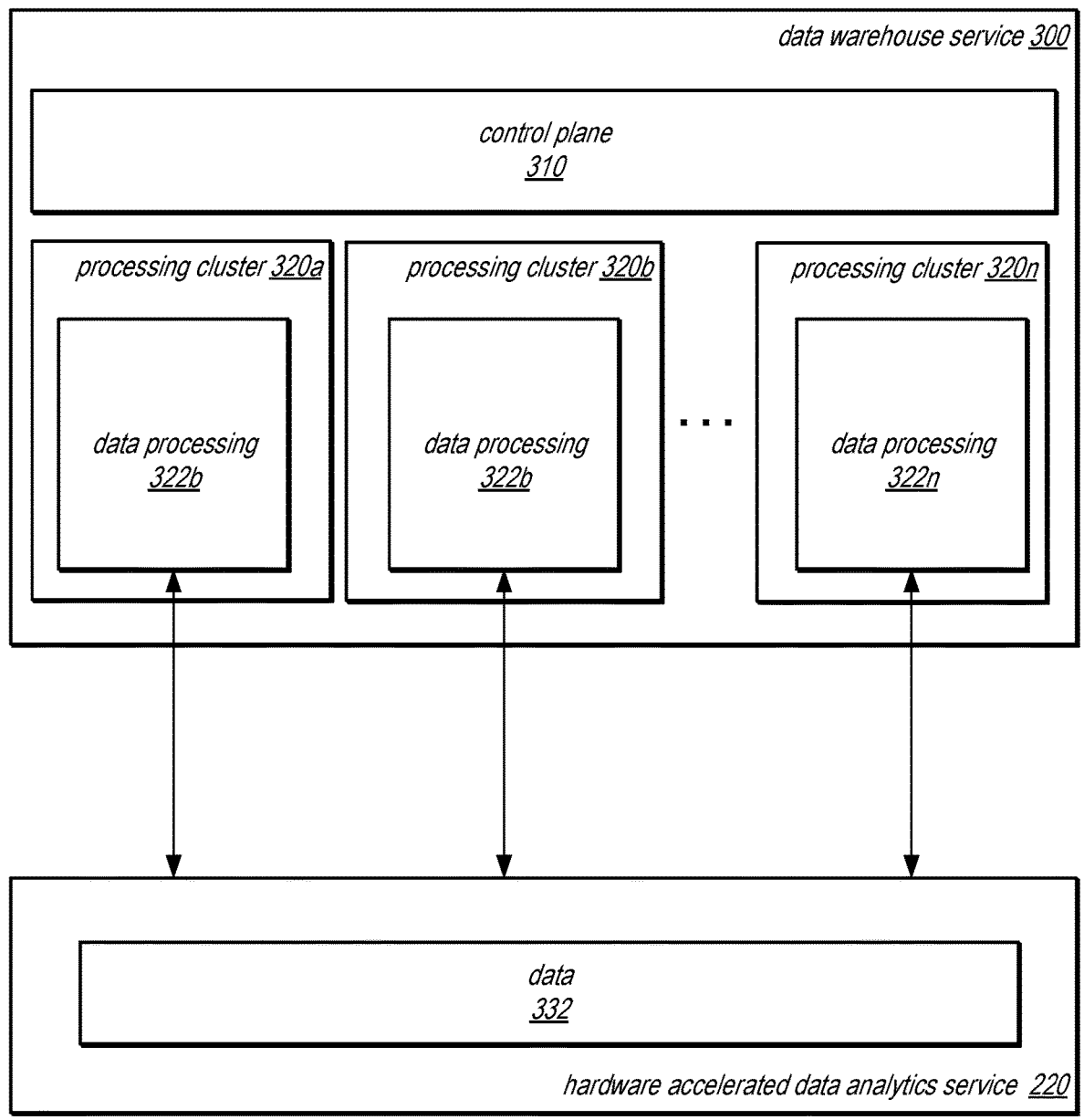
FIG. 3 is a logical block diagram of a data warehouse service that uses a hardware-accelerated data analytics service to perform data analytics operations, according to some embodiments.

In at least some embodiments, one of data processing service(s) 220 may be a data warehouse service. FIG. 3 is a logical block diagram of a data warehouse service that uses a hardware-accelerated data analytics service to perform data analytics operations, according to some embodiments. A data warehouse service, such as data warehouse service 300, may offer clients a variety of different data management services, according to their various needs. In some cases, clients may wish to store and maintain large of amounts data, such as sales records marketing, management reporting, business process management, budget forecasting, financial reporting, website analytics, or many other types or kinds of data. A client's use for the data may also affect the configuration of the data management system used to store the data. For instance, for certain types of data analysis and other operations, such as those that aggregate large sets of data from small numbers of columns within each row, a columnar database table may provide more efficient performance. In other words, column information from database tables may be stored into data blocks on disk, rather than storing entire rows of columns in each data block (as in traditional database schemes). The following discussion describes various embodiments of a relational columnar database system. However, various versions of the components discussed below as may be equally adapted to implement embodiments for various other types of database systems, such as row-oriented database systems. Therefore, the following examples are not intended to be limiting as to various other types or formats of database systems.

In some embodiments, storing table data in such a columnar fashion may reduce the overall disk I/O requirements for various queries and may improve analytic query performance. For example, storing database table information in a columnar fashion may reduce the number of disk I/O requests performed when retrieving data into memory to perform database operations as part of processing a query (e.g., when retrieving all of the column field values for all of the rows in a table) and may reduce the amount of data that needs to be loaded from disk when processing a query. Conversely, for a given number of disk requests, more column field values for rows may be retrieved than is necessary when processing a query if each data block stored entire table rows. In some embodiments, the disk requirements may be further reduced using compression methods that are matched to the columnar storage data type. For example, since each block contains uniform data (i.e., column field values that are all of the same data type), disk storage and retrieval requirements may be further reduced by applying a compression method that is best suited to the particular column data type. In some embodiments, the savings in space for storing data blocks containing only field values of a single column on disk may translate into savings in space when retrieving and then storing that data in system memory (e.g., when analyzing or otherwise processing the retrieved data).

Data warehouse service 300 may be implemented by a large collection of computing devices, such as customized or off-the-shelf computing systems, servers, or any other combination of computing systems or devices, such as the various types of systems 2000 described below with regard to FIG. 11. Different subsets of these computing devices may be controlled by control plane 310. Control plane 310, for example, may provide a cluster control interface to clients or users who wish to interact with the processing clusters 320 managed by control plane 310. For example, control plane 310 may generate one or more graphical user interfaces (GUIs) for storage clients, which may then be utilized to select various control functions offered by the control interface for the processing clusters 320 hosted in the data warehouse service 300.

As discussed above, various clients (or customers, organizations, entities, or users) may wish to store and manage data using a data management service. Processing clusters may respond to various requests, including write/update/store requests (e.g., to write data into storage) or queries for data (e.g., such as a Server Query Language request (SQL) for particular data), as discussed below with regard to FIG. 5, along with many other data management or storage services. Multiple users or clients may access a processing cluster to obtain data warehouse services. In at least some embodiments, a data warehouse service 300 may provide network endpoints to the clusters which allow the clients to send requests and other messages directly to a particular cluster. Network endpoints, for example may be a particular network address, such as a URL, which points to a particular cluster. For instance, a client may be given the network endpoint "http://mycluster.com" to send various request messages to. Multiple clients (or users of a particular client) may be given a network endpoint for a particular cluster. Various security features may be implemented to prevent unauthorized users from accessing the clusters. Conversely, a client may be given network endpoints for multiple clusters.

Processing clusters, such as processing clusters 320*a*, 320*b*, through 320*n*, hosted by the data warehouse service 300 may provide an enterprise-class database query and management system that allows users to send data processing requests to be executed by the clusters 320, such as by sending a query to a cluster control interface implemented by the network-based service. Processing clusters 320 may perform data processing 322 operations with respect to data stored locally in a processing cluster, as well as remotely stored data. For example, another service, like hardware accelerated data analytics service 220 may store (or have access to stored) data 332, which may be accessed or otherwise operated upon when queries are sent to a processing cluster 320. For example, queries sent to a processing cluster 320 may be directed to local data stored in the processing cluster and/or remotely stored data 322. Therefore, processing clusters may implement data processing, such as data processing 322*a*, 322*b*, and 322*c* to plan and execute the performance of queries with respect to local data in the processing cluster, as well as a remote data processing client to direct execution of different operations determined as part of the query plan generated at the processing cluster that are assigned to hardware accelerated data analytics service 220 with respect to processing remote data 332. In at least some embodiments, data processing 322 may support some analytics operations by relying upon hardware accelerated data analytics service 220 to perform operations, such as a query with a regular expression as a predicate, with respect to data 332.

Figure 4:
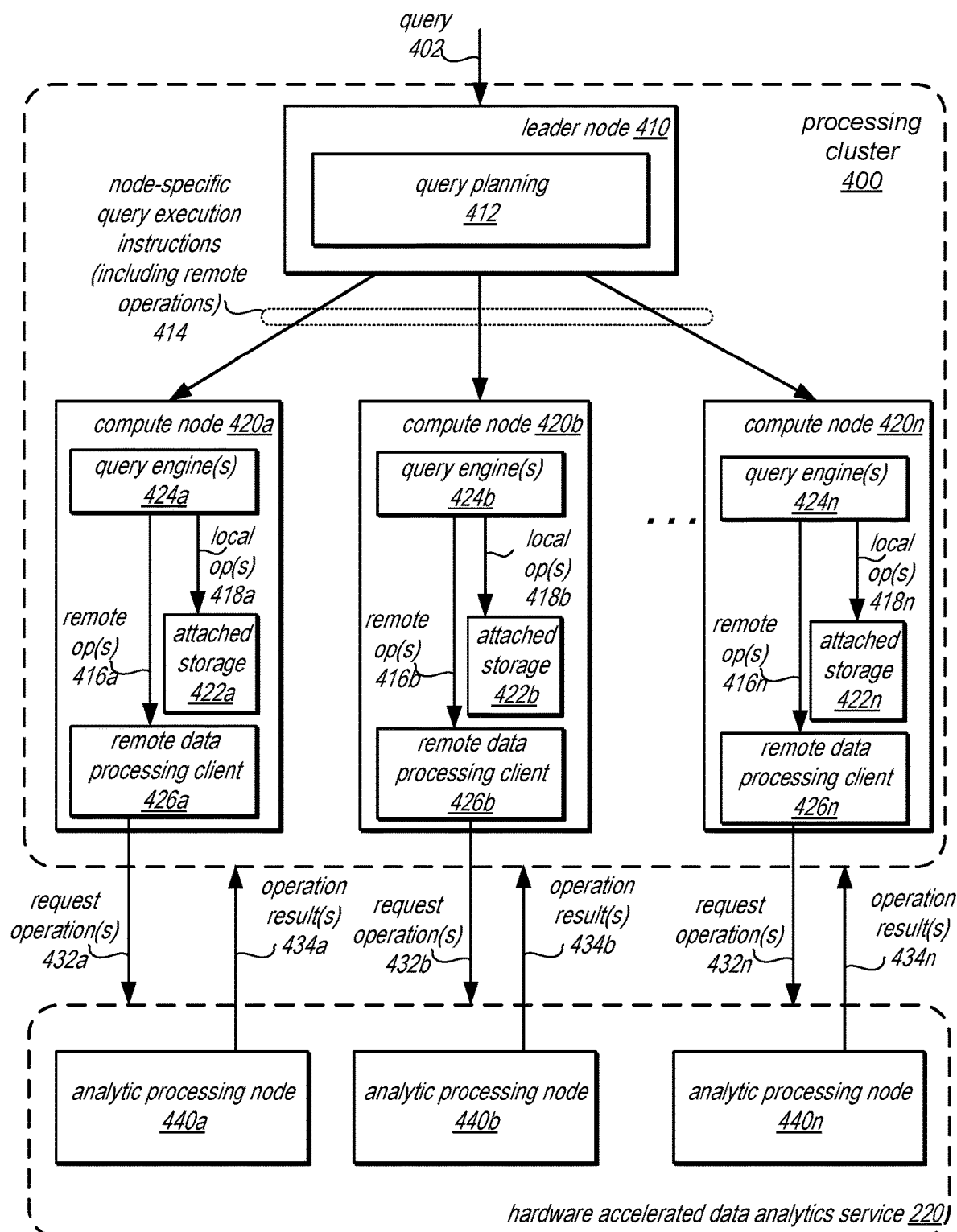
FIG. 4 is a logical block diagram illustrating an example processing cluster of a data warehouse service using a hardware accelerated data analytics service to perform combined nested data operations at a remote data store for a query, according to some embodiments.

FIG. 4 is a logical block diagram illustrating an example processing cluster of a data warehouse service using a hardware accelerated data analytics service to perform combined nested data operations at a remote data store for a query, according to some embodiments. Processing cluster 400 may be data warehouse service cluster, like processing clusters 320 discussed above with regard to FIG. 3, or another processing cluster that distributes execution of a query among multiple processing nodes. As illustrated in this example, a processing cluster 400 may include a leader node 410 and compute nodes 420*a*, 420*b*, and 420*n*, which may communicate with each other over an interconnect (not illustrated). Leader node 410 may implement query planning 412 to generate query plan(s) and instructions 414 for executing queries on processing cluster 400 that perform local and/or remote query operations, including operations to performing matching on regular expressions as discussed in further detail below. As described herein, each node in a processing cluster 400 may include attached storage, such as attached storage 422*a*, 422*b*, and 422*n*, on which a database (or portions thereof) may be stored on behalf of clients (e.g., users, client applications, and/or storage service subscribers). In other embodiments, compute nodes 420 may not implement attached storage 422, but instead may rely upon hardware accelerated data analytics service to retrieve and send data (e.g., unfiltered as stored on disk or with various operations/filters applied) in order to perform query 402.

Note that in at least some embodiments, query processing capability may be separated from compute nodes, and thus in some embodiments, additional components may be implemented for processing queries. Additionally, it may be that in some embodiments, no one node in processing cluster 400 is a leader node as illustrated in FIG. 4, but rather different nodes of the nodes in processing cluster 400 may act as a leader node or otherwise direct processing of queries to data stored in processing cluster 400. While nodes of processing cluster may be implemented on separate systems or devices, in at least some embodiments, some or all of processing cluster may be implemented as separate virtual nodes or instance on the same underlying hardware system (e.g., on a same server).

In at least some embodiments, processing cluster 400 may be implemented as part of a data warehouse service, as discussed above with regard to FIG. 3, or another one of data processing service(s) 210. Leader node 410 may manage communications with clients, such as clients 250 (or internal provider network clients) as discussed above with regard to FIG. 2. For example, leader node 410 may be a server that receives a query 402 from various client programs (e.g., applications) and/or subscribers (users), then parses them and develops an execution plan (e.g., query plan(s)) to carry out the associated database operation(s)). More specifically, leader node 410 may develop the series of steps necessary to obtain results for the query. Query 402 may be directed to data that is stored locally within processing cluster 400 (e.g., at one or more of compute nodes 420), remotely in hardware accelerated data analytics service 220 or another storage service or data store accessible to hardware accelerated data analytics service 220.

Leader node 410 may also manage the communications among compute nodes 420 instructed to carry out database operations for data stored in the processing cluster 400. For example, node-specific query instructions 414 may be generated or compiled code that is distributed by leader node 410 to various ones of the compute nodes 420 to carry out the steps needed to perform query 402, including executing the code to generate intermediate results of query 402 at individual compute nodes may be sent back to the leader node 410. Leader node 410 may receive data and query responses or results from compute nodes 420 in order to determine a final result for query 402. A database schema, data format and/or other metadata information for the data stored among the compute nodes, such as the data tables stored in the cluster, may be managed and stored by leader node 410. Query planning 412 may account for remotely stored data by generating node-specific query instructions that include remote operations to be directed by individual compute node(s).

Processing cluster 400 may also include compute nodes, such as compute nodes 420*a*, 420*b*, and 420*n*. Compute nodes 420, may for example, be implemented on servers or other computing devices, such as those described below with regard to computer system 2000 in FIG. 11, and each may include individual query processing "slices" defined, for example, for each core of a server's multi-core processor, one or more query processing engine(s), such as query engine(s) 424*a*, 424*b*, and 424*n*, to execute the instructions 414 or otherwise perform the portions of the query plan assigned to the compute node. Query engine(s) 424 may access a certain memory and disk space in order to process a portion of the workload for a query (or other database operation) that is sent to one or more of the compute nodes 420. Query engine 424 may access attached storage, such as 422*a*, 422*b*, and 422*n*, to perform local operation(s), such as local operations 418a, 418b, and 418n. For example, query engine 424 may scan data in attached storage 422, access indexes, perform joins, semi joins, aggregations, or any other processing operation assigned to the compute node 420.

Query engine 424a may also direct the execution of remote data processing operations, by providing remote operation(s), such as remote operations 416a, 416b, and 416n, to remote data processing clients, such as remote data processing client 426a, 426b, and 426n. Remote data processing clients 426 may be implemented by a client library, plugin, driver or other component that sends request operations, such as request operation(s) 432a, 432b, and 432n to hardware accelerated data analytics service 220. In some embodiments, hardware accelerated data analytics service 220 may implement a common network endpoint to which request operation(s) 432 are directed, and then may dispatch the requests to respective analytic processing nodes, such as analytic processing nodes 440a, 440b, and 440n. Remote data processing clients 426 may read, process, or otherwise obtain results from analytic processing nodes, including partial results of different operations (e.g., a stream of filtered tuples) and may provide operation result(s), including result(s) 434a, 434b, and 434c, back to query engine(s) 424, which may further process, combine, and/or include them with results of local operations 418, or further finalizing processing of the query if no local operations 418 are invoked for query 402.

Compute nodes 420 may send intermediate results from queries back to leader node 410 for final result generation (e.g., combining, aggregating, modifying, joining, etc.). Remote data processing clients 426 may retry operation request(s) 432 that do not return within a retry threshold. As hardware accelerated data analytics service 220 may be stateless, processing operation failures at processing node(s) 440 may not be recovered or taken over by other processing nodes 440, remote data processing clients 426 may track the success or failure of requested operation(s) 432, and perform retries when needed.

Attached storage 422 may be implemented as one or more of any type of storage devices and/or storage system suitable for storing data accessible to the compute nodes, including, but not limited to: redundant array of inexpensive disks (RAID) devices, disk drives (e.g., hard disk drives or solid state drives) or arrays of disk drives such as Just a Bunch Of Disks (JBOD), (used to refer to disks that are not implemented according to RAID), optical storage devices, tape drives, RAM disks, Storage Area Network (SAN), Network Access Storage (NAS), or combinations thereof. In various embodiments, disks may be formatted to store database tables (e.g., in column oriented data formats or other data formats).

Figure 5:
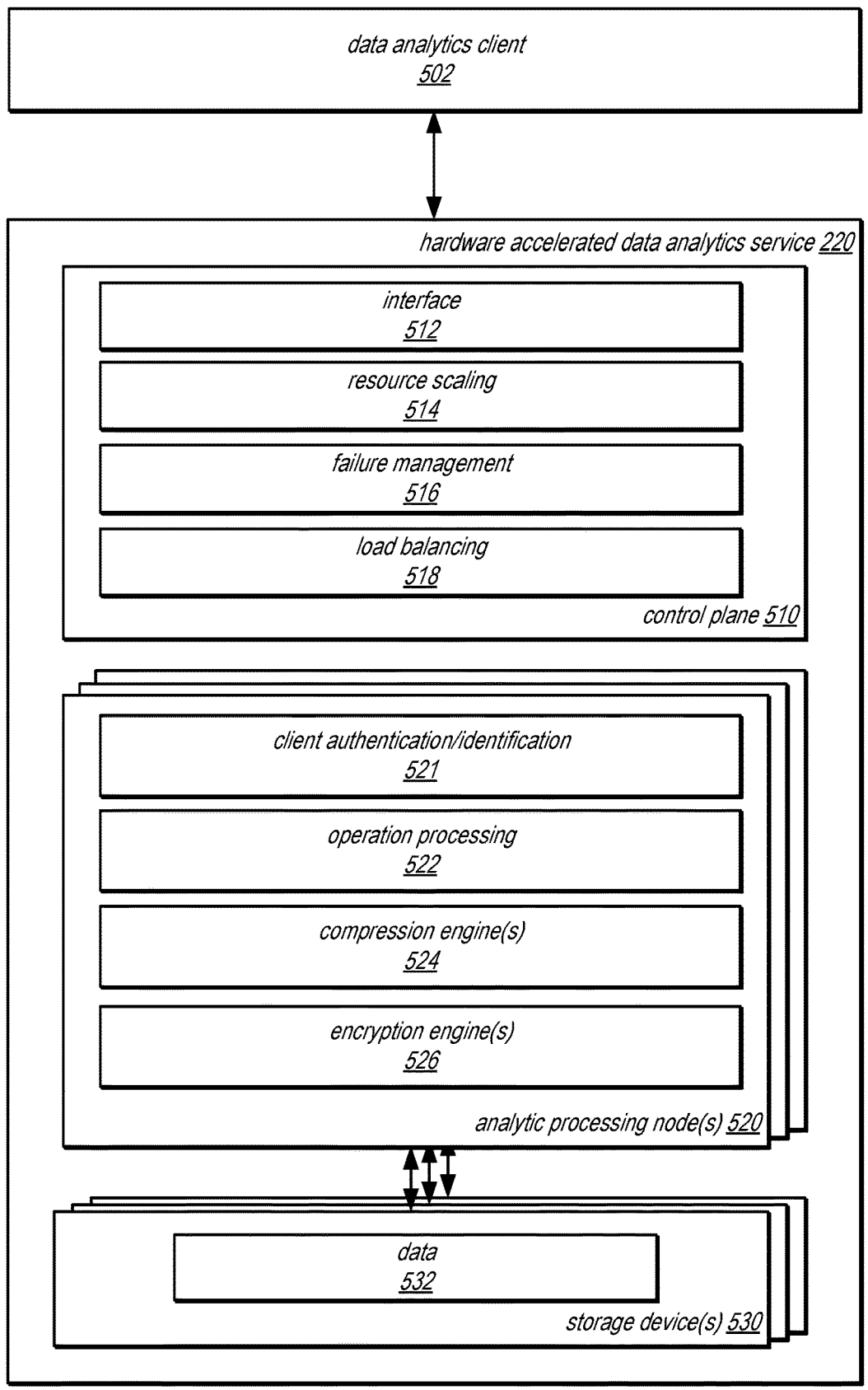
FIG. 5 is a logical block diagram illustrating a hardware accelerated data analytics service, according to some embodiments.

FIG. 5 is a logical block diagram illustrating a hardware accelerated data analytics service, according to some embodiments. As noted above in FIG. 2, hardware accelerated data analytics service 220 may receive requests to perform processing operations with respect to data stored 532 stored in a data storage service. Processing requests may be received from a client, such as remote data analytics client(s) 502 (which may another data processing service 210, like data warehouse service 300 or another data processing client, such as a database engine/cluster or map reduce cluster implemented outside of provider network 200 and communicating with hardware accelerated data analytics service 220 in order to process queries with respect to data stored within provider network 200 or to process data stored outside of provider network 200 (when the data is made accessible to hardware accelerated data analytics service 220).

Hardware accelerated data analytics service 220 may implement a control plane 510 and multiple analytic processing node(s) 520 to execute processing requests received from remote data processing client(s) 502. Control plane 510 may arbitrate, balance, select, or dispatch requests to different processing node(s) 520 in various embodiments. For example, control plane 510 may implement interface 512 which may be a programmatic interface, such as an application programming interface (API), that allows for requests to be formatted according to the interface 512 to programmatically invoke operations. In some embodiments, the API may be defined to allow operation requests defined as objects of code generated at and sent from remote data processing client(s) 502 (based on a query plan generated at remote data processing client(s) 502) to be compiled or executed in order to perform the assigned operations at hardware accelerated data analytics service 220.

In some embodiments, hardware accelerated data analytics service 220 may implement load balancing 518 to distribute remote processing requests across different analytic processing node(s) 520. For example, a remote processing request received via interface 512 may be directed to a network endpoint for a load-balancing component of load balancing 518 (e.g., a load balancing server or node) which may then dispatch the request to one of analytic processing node(s) 520 according to a load balancing scheme. A round-robin load balancing, for instance, may be used to ensure that remote data processing requests are fairly distributed amongst analytic processing node(s) 520. However, various other load-balancing schemes may be implemented. As hardware accelerated data analytics service 220 may receive many remote data processing requests from multiple remote data processing client(s) 502, load balancing 518 may ensure that incoming requests are not directed to busy or overloaded analytic processing node(s) 520. In some embodiments, mapping or other routing information may be maintained so that requests for data are mapped to analytic processing node(s) 530 that store the data in attached storage for performing analytics operations (as opposed to obtaining the data from other storage locations as may be performed in other embodiments).

Hardware accelerated data analytics service 220 may also implement resource scaling 514. Resource scaling 514 may detect when the current request rate or workload upon a current number of analytic processing node(s) 520 exceeds or falls below over-utilization or under-utilization thresholds for processing nodes. In response to detecting that the request rate or workload exceeds an over-utilized threshold, for example, then resources scaling 514 may provision, spin up, activate, repurpose, reallocate, or otherwise obtain additional analytic processing node(s) 520 to perform received remote data processing requests. Similarly, the number of analytic processing node(s) 520 could be reduced by resource scaling 514 in the event that the request rate or workload of analytic processing node(s) falls below the under-utilization threshold.

Hardware accelerated data analytics service 220 may also implement failure management 516 to monitor analytic processing node(s) 520 and other components of hardware accelerated data analytics service 220 for failure or other health or performance states that may need to be repaired or replaced. For example, failure management 516 may detect when an analytic processing node fails or becomes unavailable (e.g., due to a network partition) by polling processing node(s) 520 to obtain health or performance status information. Failure management may initiate shutdown or halting of processing at failing analytic processing node(s) 520 and provision replacement analytic processing node(s) 520.

Figure 11:
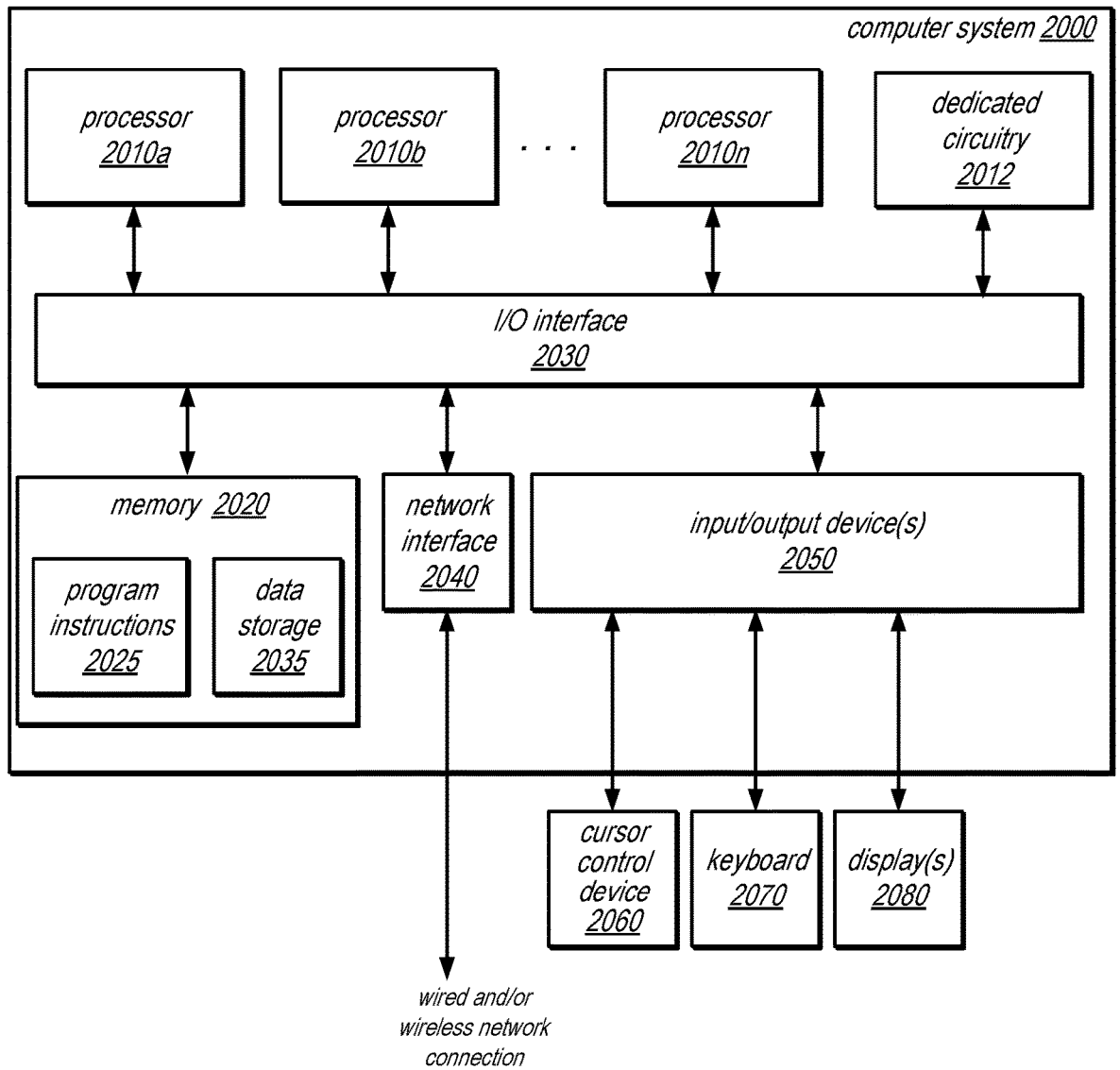
FIG. 11 illustrates an example system that implements the various methods, techniques, and systems described herein, according to some embodiments.

Analytic processing node(s) 520 may be implemented as separate computing nodes, servers, or devices, such as computing systems 2000 in FIG. 11, to perform data processing operations on behalf of remote data processing client(s) 502. Analytic processing node(s) 520 may implement stateless, in-memory processing to execute operations, in some embodiments. In this way, processing node(s) 520 may have fast data processing rates. Analytic processing node(s) 520 may implement client authentication/identification 521 to determine whether a remote data processing client 502 has the right to access data 532. For example, client authentication/identification 521 may evaluate access credentials, such as a username and password, token, or other identity indicator by attempting to connect with storage device 530. If the credentials are not valid, then the data processing node 502 may send an error indication to remote data analytics client 502.

Analytic processing node(s) 520 may implement operation processing 522 which may perform multiple different processing operations, as discussed in detail below with regard to FIGS. 6-8, to perform various analytics operations upon data 532 before returning operation results and/or retrieve data without modification or analysis. In some embodiments, data 532 may be stored in encrypted or compressed format. Processing node(s) 520 may implement compression engine(s) 524 to decompress data 532 according to a compression technique identified for data 532, such as lossless compression techniques like run-length encoding, Lempel-Ziv based encoding, or bzip based encoding. Processing node(s) 520 may implement encryption engine(s) 526 to decrypt data 532 according to an encryption technique and/or encryption credential, such as a key, identified for data 532, such as symmetric key or public-private key encryption techniques.

In some embodiments, analytic processing node(s) 530 may be directly attached to one or more storage devices 530. For example, storage devices 530 may include, but not be limited to: redundant array of inexpensive disks (RAID) devices, disk drives (e.g., hard disk drives or solid state drives) or arrays of disk drives such as Just a Bunch Of Disks (JBOD), (used to refer to disks that are not implemented according to RAID), optical storage devices, tape drives, RAM disks, Storage Area Network (SAN), Network Access Storage (NAS), or combinations thereof.

Analytics processing node(s) 520 may include dedicated circuitry on a host system, such as dedicated circuitry 2012 of system 2000 in FIG. 11, like an application specific integrated circuit (ASIC), field programmable gate array (FPGA), or system-on-a-chip (SoC), in order to implement hardware optimized and thus accelerated for data analytics operations. FIG. 6 is a logical block diagram of operation processing at an analytics processing node that utilizes a Field Programmable Gate Array (FPGA) to implement filters for performing data analytics operations, according to some embodiments. Although similar features and implementations could be achieved using other forms of integrated circuitry.

Figure 6:
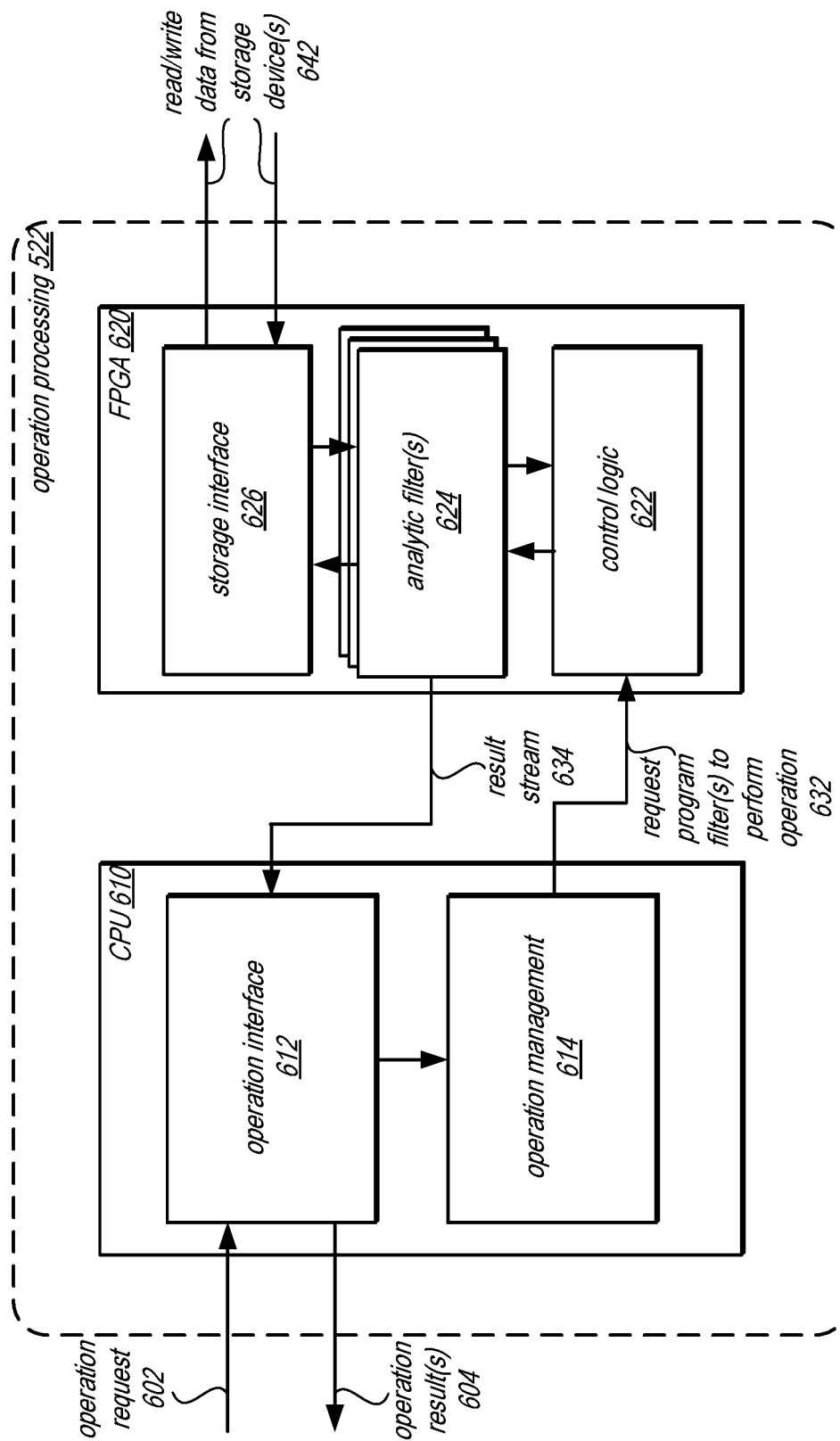
FIG. 6 is a logical block diagram of operation processing at an analytics processing node that utilizes a Field Programmable Gate Array (FPGA) to implement filters for performing data analytics operations, according to some embodiments.

As illustrated in FIG. 6, operation processing 522 may utilize both a general purpose processor, like CPU 610, and an FPGA 620, in order to perform analytics operations. CPU 610 may execute program instructions to implement an operation interface 612 for an analytics processing node, in some embodiments. Operation interface 612 may be implemented, for example, as an API that a data analytics client can invoke to perform data operations for a query, in some embodiments. As multiple different types of operations may be supported, in some embodiments, the operation interface may identify which type of operation is to be performed and what data is to be accessed according to parameters provided via operation interface. For example, operation request 602 may specify an operation type or identifier, parameters for performing the operation (e.g., a regular expression for applying a regular expression filter), and identify which data is to be accessed and operated upon (e.g., by identifying a file name, object or table name, network address, block address or range of addresses, etc.).

In various embodiments, operation management 614 may manage performance of operations at FPGA 620. For example, operation management 614 may determine additional parameters or values to perform a requested operation. For example, if the operation request is to apply a regular expression filter to a set of items (e.g., tuples of database), then operation management 614 may compile the regular expression included in the operation request 602 into a nondeterministic finite automata (NFA) (e.g., according to a compiler for the language that specified the regular expression such as POSIX, glob, or PERL, among others) and then convert the NFA into respective bit formats for performing lookup operations for each respective state of the NFA so that the state machine components of the NFA can be programmed and evaluated at an analytics filter 624. For example, operation management may loop or iterate through the NFA states to generate values for lookup tables that indicate whether an input character at that character position sets the state value to TRUE. The parameter values may be written, in some embodiments, to a memory (not illustrated) which FPGA 620 can access in order to retrieve the parameters when signaled to perform the operation.

Operation management 614 can send a signal or other request 632 to control logic 622 of FPGA 620 to perform an operation. As illustrated in FIG. 6, multiple analytic filter(s) 624 may be implemented, which may be programmed or instructed to perform different operations. Control logic 622 may signal to an available one of analytic filters 624 to perform the requested operation. Control logic 622 may provide the parameter values to an analytic filter 624. For example, in some embodiments, a ticket paradigm may be implemented for signaling operations to FPGA 620. Operations management 614 may write a ticket in a memory accessible to FPGA 620 (e.g., host memory or FPGA memory) and may signal the presence of the ticket by writing an address location of the ticket to a ticket control register. The ticket may include the operation type, which includes the identity of the operation to perform (e.g., bypass filter, delete data, modify data, evaluate predicates and produce a bitmask or other indication as to which data matches a predicated, such as a predicate indicated by a regular expression), an identifier specific to the operation (as multiple operations of the same type can be performed at different analytics filters), information to program the filter operations (e.g., lookup table values, accept vector values for a positive match, and so on), size of data items (e.g., tuple size), location of data, among other information. In some embodiments, control logic 622 may implement a queue or other data structure for adding new operations and removing completed operations to be performed at one of analytic filter(s) 624 (e.g., by queuing ticket pointers).

FPGA 620 may implement one or multiple analytic filter(s) 624, in various embodiments. Analytic filter(s) 624 may be programmable to perform different operations for different requests. For example, two different analytic filters 624 can filter tuples from different tables according to different regular expressions programmed to the analytic filters at or in near parallel. Other operations, such as numerical comparisons, string comparison, aggregation operations (e.g., summation, count, average, etc.) may be performed by analytic filters in addition to regular expression filtering, as discussed below. Analytic filter(s) 624 may utilize storage interface 626 to read from and write data to storage devices 642. In some embodiments, storage interface 626 may send read and write requests to a peripheral device connected to a host system for the analytics processing node and/or the storage devices, which may retrieve the data and perform other processing of the data, such as encryption/decryption and/or compression/decompression.

Figure 7:
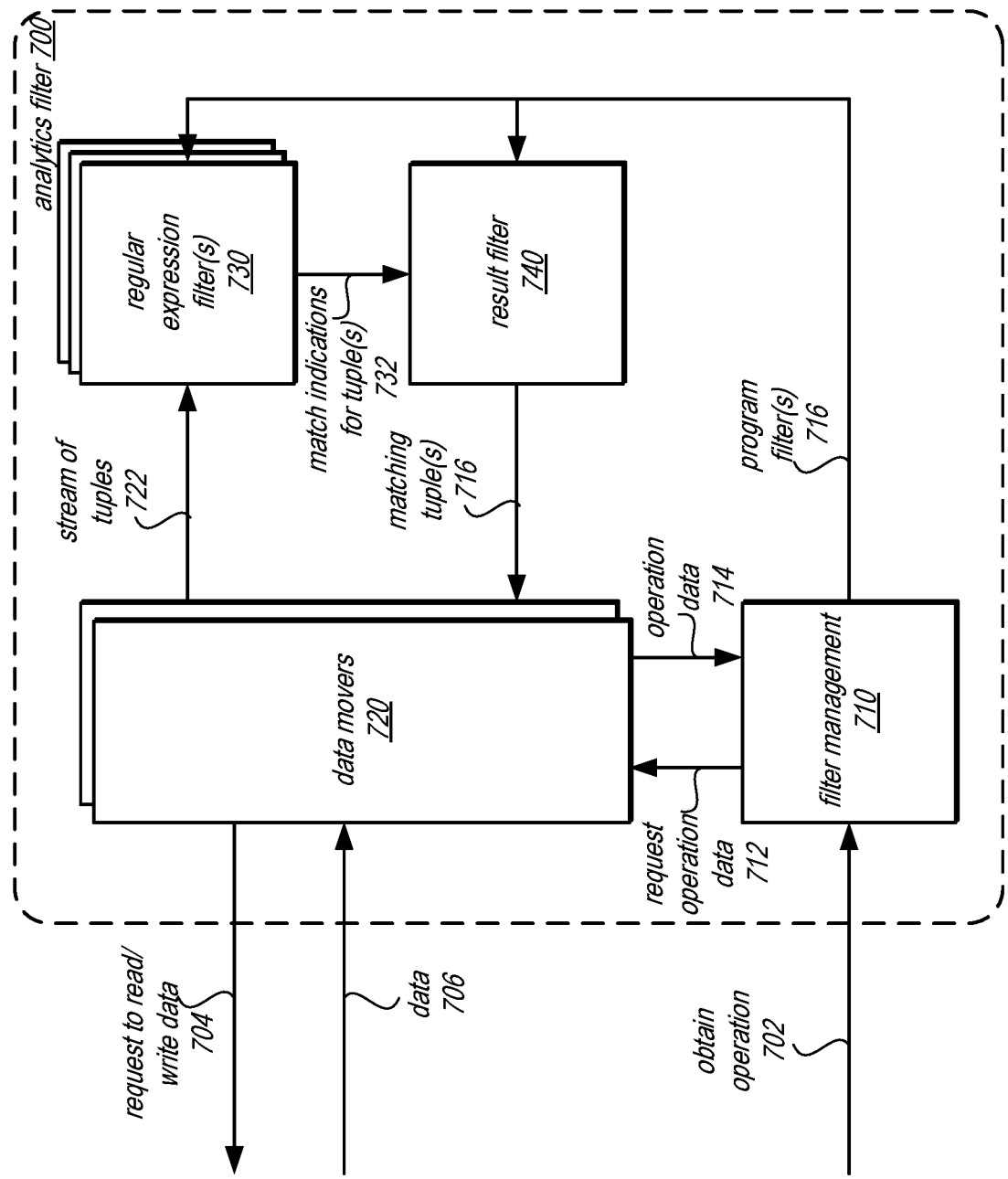
FIG. 7 is a logical block diagram of an analytics filter implemented in an FPGA for performing data analytics operations, according to some embodiments.

FIG. 7 is a logical block diagram of an analytics filter implemented in an FPGA for performing data analytics operations, according to some embodiments. Analytics filters, like analytics filters 624 in FIG. 6, may be able to perform different operations. One such operation is a regular expression filter, as discussed in more detail below with regard to FIG. 8. In addition to the operation filter itself, other supporting components of an analytics filter may be implemented in order to allow for each filter to perform an operation independent of other operations.

For example, as illustrated in FIG. 7, analytics filter 700 may include a filter management component 710. Filter management component 710 may obtain an operation 702 to perform. For example, filter management 710 may implement state or status registers which indicate when an operation at filter 700 is in progress when the operation completes (or fails), filter management 710 may detect the completion and request or get another operation to perform (e.g., by removing an operation from an operation queue in control logic 622 in FIG. 6). Filter management 710 may request operation data 712 from a data mover 720, which may be able to access operation data (e.g., in CPU 610 or FPGA 620 memory) by requesting 704 and receiving 706 the operation data in order to initiate programming 716 of the one or more regular expression filter(s) 730 and result filter 740 based on the received operation data 714.

For example, filter management 710 may request the ticket data of the ticket obtained from the queue (e.g., according to an address or location of the ticket data obtained from the queue). Data mover(s) 720 may read the ticket data from the identified location (e.g., in host memory or FPGA memory), and return the ticket data to filter management 710. Filter management 710 may then parse ticket data in order to perform operations to update configuration settings for regular expression filter(s) 730 and result filter 740 by modifying register values, lookup table values, and so on, as specified in the ticket data. For example, the various lookup table values for the NFA states to be detected by regular expression filter(s) 730, as discussed below.

Filter management 710 may also update configuration parameters for data movers 720 to begin retrieving data from one or more storage devices for filtering at regular expression filter(s) 730, in some embodiments. For example, a starting location or address in a storage device and an amount or length of data to read may be provided so that data movers 720 may initiate requests 704 to receive data 706 from the location and provide the data as a stream of tuples 722 to regular expression filter(s) 730. Configuration parameters may include size of tuples (e.g., in bytes), in some embodiments.

Stream of tuples 722 may be provided to regular expression filter(s) 730, which may evaluate the stream of tuples and provide match indications 732 for tuples, as discussed in detail below with regard to FIG. 8. Result filter 740 may be implemented, in some embodiments to format or output matching tuple(s) 716 as a stream so that data movers 720 can write 704 the matching tuple(s) 716 to a memory or other location to be provided as part of an operation result by operation interface 612 as discussed above in FIG. 6. For example, result filter 740 may perform data packing to shift together tuples that match the regular expression, removing gaps between filters, and/or remove non-matching tuples from the tuple stream so that only those matching tuples are transmitted as part of matching tuple(s) 716. In other embodiments, result filter 740 may provide a bitmask or other indication of which tuples match the regular expression (and which do not) along with the tuple stream (not illustrated). Result filter 740 may, in some embodiments, detect when a last tuple in the stream has been evaluated by regular expression filter 730 and signal a completion of the operation to filter management 710 and/or data movers 720 so that operation management 614 can fetch operation result(s) 604 and/or signal completion of the operation to a client. For example, result filter can generate and provide a ticket receipt to be written to a receipt location for the ticket in a host memory to indicate completion to operation management 614 which may poll or otherwise detect the completion at the receipt location.

Please note that an analytics filter like analytics filter 700 or 624 in FIG. 6 can perform multiple different operations, in some embodiments. Therefore additional components to perform other operations in addition to regular expression filtering (e.g., number comparisons and/or operations, or other string-based operations) may be implemented which are not illustrated and which may provide results via result filter 740.

Figure 8:
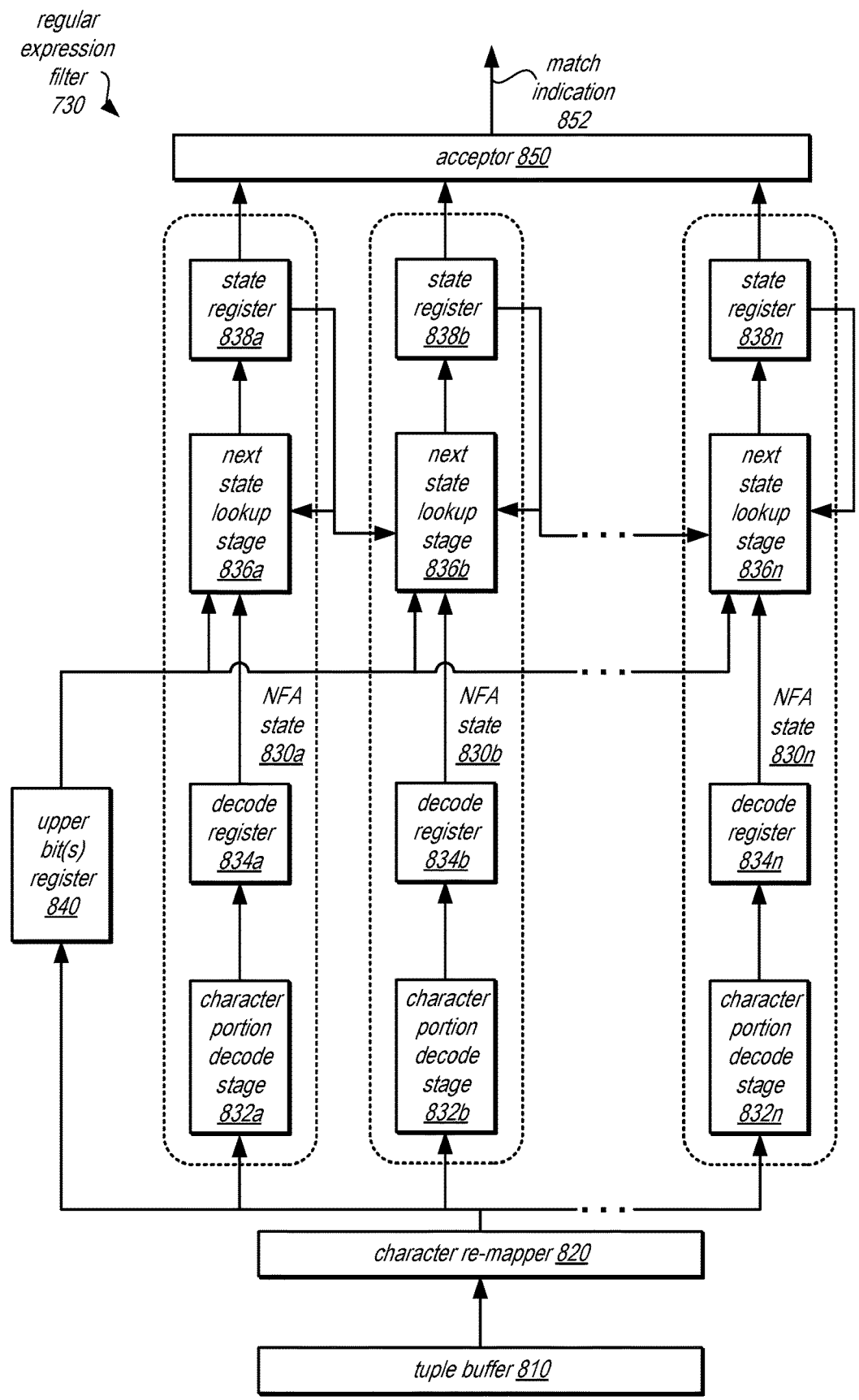
FIG. 8 is a logical block diagram of a regular expression filter that shares character data across lookups in order to identify matches to a regular expression, according to some embodiments.

FIG. 8 is a logical block diagram of a regular expression filter that shares character data across lookups in order to identify matches to a regular expression, according to some embodiments. As discussed above with regard to FIG. 1, sharing character data across lookups may allow for area savings and a scalable design for dynamically programming evaluations of NFA states to identify matches to a regular expression.

Regular expression filter 730 may include a tuple buffer 810, in some embodiments. Tuple buffer 810 may store a tuple (e.g., an entry in table) from tuple stream 722. In some embodiments, regular expression filters 730 may be implemented each with a corresponding tuple buffer. In such embodiments, a tuple distributer (not illustrated) may distribute different tuples from the stream of tuples 722 to different regular expression filters 730 for evaluation in parallel, increasing the speed at which tuple evaluation with regard to the regular expression can be performed. For example, the tuple distributer may implement a round-robin distribution scheme, in one embodiment. In other embodiments, different distribution schemes or scheduling techniques (e.g., fair queuing, proportionally fair scheduling, and so on) may be implemented. In such scenarios, result filter 740 can combine the results from the multiple regular expression filters into a single result stream of matching tuples 716.

In some embodiments, individual characters (e.g., bytes) of a tuple may be obtained from tuple buffer 810 one at a time and processed through regular expression filter 730. Thus, a first character of a tuple may be evaluated through the features of regulation filter 730, including multiple NFA states 830, in parallel, in some embodiments. An end character, bit, or other indication may be received after the last character in a tuple, in some embodiments, which may trigger a determination of whether the tuple matches the regular expression at acceptor 850. After a tuple evaluation is complete, regular expression filter 730 may be returned to a clean or initial state (e.g., where the register values 834, 840, and 838 are reset.

In various embodiments, regular expression filter 730 may implement character re-mapper 820. Character re-mapper 820 may be a lookup table that maps an input character (e.g., via 8 bits of the character byte to another 8 bits), in some embodiments, and which may perform the split of bits between upper bit(s) register 840 and character portion decode stages 832. In this way, regular expression filter 730 may support character class for regular expressions. For example, if a regular expression were to include a feature that wanted to search for both "a" and "e" in a same expression "gr[ae]y" the character re-mapper 820 would map the character bits of "a" and "e" to the same output value, which would be used to detect a match according to the various NFA states 830. In this way, alternative states do not have to be programmed for each regular expression "gray" and "grey", saving the number of NFA states to be utilized in regular expression filter 730. Various types of character classes could be supported, in some embodiments, including ranges of characters or alternative characters to match a single character in the regular expression or combinations of characters or range, repeating character classes, upper and lower case classes, among other supported character classes.

Different NFA states, such as NFA states 830a, 830b, to 830n, may be implemented for detecting tuples that match varying length regular expressions up to the maximum number of NFA states supported in regular expression filter 730 (e.g., if 36 NFA states are implemented then a regular expression detectable in 36 states or less may be supported). Not all NFA states 830 may be utilized, and thus in some embodiments an acceptor 850 may be programmed to ignore the output of those NFA states 830 not utilized for a regular expression. In this way, regular expression filter 730 may be flexible and scale to match a number of NFA states used to detect a regular expression without programing un-used regular expression states.

Each NFA state 830 may be implemented using a character portion decode stage, such as character portion decode stages 832a, 832b, to 832n, in some embodiments. Character portion decode stage 832 may use a lower number of bits (e.g., 6 least significant bits of an 8 bit character) as lookup table inputs, in some embodiments. In such scenarios, character portion decode stages 832 may be implemented using standard FPGA lookup table components so that a single lookup table can perform the decode of the portion of the character to return a character match.

Consider the example regular expression given above "gr[ae]y". Character portion decode stage 832a may be a lookup table for an NFA state that determines whether "g" is present by mapping the lower bits received from a character of a tuple to a match or no-match value (e.g., "1" and "0" respectively). Thus if the 8 bit value of "g" is "01100111" the lookup table may output a "0" value for all input 6 bits that do not match "100111" and a "1" when input bits "100111" are received. Decode registers, such as decode registers 834a, 834b, to 834n may be implemented to store the output value from the decode stage 832, a "0" or "1", for instance.

An NFA state 830 may also include a next state lookup stage, such as next state lookup stages 836a, 836b, to 836n. Next state lookup stage 836 may be implemented as a lookup table that accepts for a lookup, upper bit(s) register 840, which may be the shared character data across each next state lookup stage 836, the value stored in decode register 834, and the output of the evaluation of the same next state look stage for an immediately previous character (e.g., as indicated by the arrow from state register 838a that points to next state lookup stage 836a). For some next state lookup stages 838, such as next state lookup stages 836b to 836n, the output of the evaluation of another NFA state 830 may also be input to the next state lookup stage 836. For example, as illustrated in FIG. 8, an arrow from state register 838a of NFA state 830a is input to next state lookup stage 836b of NFA state 830b. In this way, each NFA state 830 can be individually programmed and yet still maintain the capability be programmed dependent on whether a prior NFA state 830 is met. For example, turning back to the "gr[ae]y" example, if NFA state 830b were to detect the "r", next state lookup stage 836b may not indicate a satisfied value (e.g., a "1") unless both decode register 834b and upper bit(s) register 840 indicated an "r" and that a previous character "g" satisfied NFA state 830a as indicated by the output of state register 838a. Although not illustrated, in some embodiments, another input to next state lookup stage 836 can indicate an optionally selectable "jump" state in order to support alternation in a regular expression.

In some embodiments, next state lookup stages 836 can accept additional inputs (not illustrated) in order to implement additional regular expression state matching features. For example, the additional input values could be from counters to drive the next state logic of selected state bits, to make implementing searches for repetitions in a regular expression less expensive. In such an embodiment, a subset of the next state lookup stages 836 can have an input arc from a counter with a programmable terminal value, that itself has an increment and a clear based on a pair of next state lookup stages 836. A regular expression search for the pattern "aaaaaaaaaaaabc" could be found based on the counter. The counters would reduce the cost of mapping the NFA such that the counter would have a terminal of value (e.g., 12 for 12 "a"), and would clear (go back to its initial value) when a non-matching symbol arrived (e., when a non-matching "a" arrived), and down-count when a matching symbol arrived (e.g., down-count when an "a" arrived). Other more complex patterns could take advantage of the counter inputs. For instance, a regular expression "(countme){4}bc" (e.g., "countmecountmecountmecountmebc" could be found if the terminal value of the counter were set to 4, and incremented when we get to the "e" in "countme" and where the counter clears if we get something other than "countme."

NFA states 830 may implement stage registers, such as state registers 838a, 838b, to 838n, to store the output of next state lookup stage 836, indicating whether for that cycle, the NFA state 830 is satisfied or not (e.g., by a "1" or "0" value). For some regular expressions, once set to satisfied a stage register may not change (e.g., as the output value of "1" fed back to the next state lookup stage 836 of that NFA state 830 may always cause an output value of "1" to be written to state register 838. However, for other regular expressions a stage register 838 value may change from character to character.

Regular expression filter 730 may implement accepter 850 which may evaluate a vector or array of state register 838 values when an indication that a tuple has been evaluated to indicate if a match 852 is or is not indicated for the tuple (e.g., a "1" for a match or a "0" for no match). Acceptor 850 may ignore state register 838 values until the indication that a tuple has been evaluated has been received and may be programmed to ignore the outputs of those state registers of implemented but not used NFA states 830. In some embodiments, acceptor 850 may be implemented as a wide (and in some circumstances pipelined) AND→OR block, wherein the AND mask may be set to monitor only states that have to be high (e.g., "1") at the end of the tuple for a match indication 852 to be indicated. In at least some embodiments, wherein regular expression filter 730 is implemented on an FPGA acceptor 850 can be implemented using DSP blocks, an efficient hard macro supported when programming FPGAs.

In view of the filter components discussed above with regard to FIG. 8, various regular expression features may be supported. For instance, as noted above character classes and alternations may be supported using the above features. In some embodiments, Kleene closure (or start or operator) within regular expressions may be supported by the features of regular expression filter 730.

Figure 9:
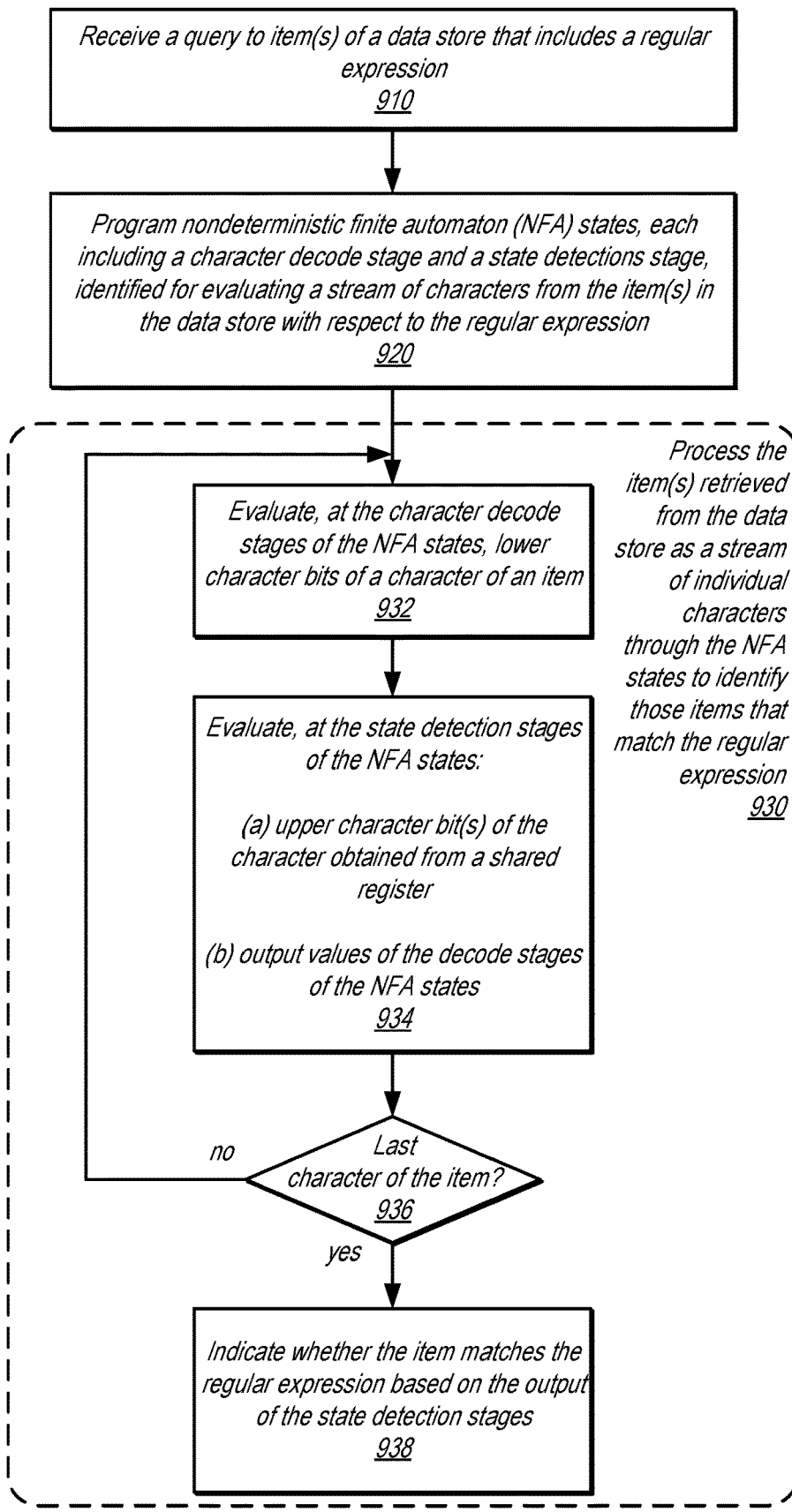
FIG. 9 is a high-level flowchart illustrating methods and techniques to implement sharing character data across lookups in a regular expression filter to identify matches to a regular expression, according to some embodiments.

Although FIGS. 2-8 have been described and illustrated in the context of a provider network implementing different data processing services, like a data warehousing service, that utilizes a hardware accelerated analytics service, the various components illustrated and described in FIGS. 2-8 may be easily applied to other data processing systems that implement different query engines or data processing platforms that support regular expression searching. As such, FIGS. 2-8 are not intended to be limiting as to other embodiments of combining nested data operations for distributed query processing. FIG. 9 is a high-level flowchart illustrating methods and techniques to implement sharing character data across lookups in a regular expression filter to identify matches to a regular expression, according to some embodiments.

Various different systems and devices may implement the various methods and techniques described below, either singly or working together. For example, a data processing system, like a database server, may implement dedicated circuitry like an FPGA or ASIC to implement a regular expression filter that shares character data across lookups to identify matches to a regular expression as part of a same host system as the database server and thus may implement some or all of the various methods. Different combinations of services implemented in different provider networks operated by different entities may implement some or all of the methods (e.g., a data warehouse cluster in a service of a first provider network and a hardware accelerated analytics processing service in a second provider network). Alternatively, various other combinations of different systems and devices located within or without provider networks may implement the below techniques. Therefore, the above examples and or any other systems or devices referenced as performing the illustrated method, are not intended to be limiting as to other different components, modules, systems, or devices.

As indicated at 910, a query to item(s) of a data store may be received that includes a regular expression, in some embodiments. For example, a query engine for a database may receive a request via an interface that includes a regular expression specified according to a regular expression language (e.g., POSIX, glob, PERL, etc.). In some embodiments, the query may be formatted according to a query interface that allows regular expression filter requests to be directly submitted to and performed by dedicated circuitry.

As indicated at 920, nondeterministic finite automaton (NFA) states identified for evaluating a stream of characters from the item(s) in the data store with respect to the regular expression may be programmed, in some embodiments. Programming of the NFA states may be dynamically performed so that the values of lookup tables implementing the character decode stage and state detection stage of each NFA state (as discussed above with regard to FIGS. 1 and 8) are performed after the regular expression to be matched is received. For example, a controller for the dedicated circuitry may compile the regular expression into an NFA. Then, the controller may determine lookup values for components like the character decode stages and state detections stages (e.g., how different combinations of input bit values map to an output value). The controller may then signal or request to the regular expression filter (e.g. to a filter management component) to store the lookup values to the different stages (and other components, like an acceptor and character re-mapper).

As indicated at 930, the item(s) may be retrieved from the data store and processed as a stream of individual characters through the NFA states to identify those items that match the regular expression filter, in some embodiments. For example, an item (e.g., a tuple) may be stored to a buffer for a regular expression filter). Then individual characters may be removed from the buffer (e.g., as bytes) and processed in parallel through the different NFA states programmed to determine whether the item matched the regular expression. As indicated at 932, lower character bits (e.g., according to a significance ordering whether the lower character bits are the least significant bits as opposed to the most significant bits) of a character of an item may be evaluated at the character decode stages of the NFA states. Output values determined for the decode states (e.g., "0" or "1") may be generated as a result of the character decode stages.

As indicated at 934, upper character bit(s) of the character obtained from a shared register and the output values of the decode stages of the NFA states may be evaluated at the state detection stages of the NFA states, in some embodiments. For example, these values may be used as inputs to a lookup table implementing the state detection state. Other inputs, such as the previous output value of the state detection stages, previous output value of adjacent state detection stages, and jump values may also be used, in some embodiments. Based on the input values, output values for the state detection stages may be determined. Note that both "upper" and "lower" character bits are exemplary of other divisions of character data in order to perform the described techniques. For instance, the "lower" bits could be shared across NFA states and the "upper" bits used as input to individual character bit decode stages.

The characters of an item may be processed one character at a time until a last character of the item is evaluated, as indicated at 936. The last character of the item may be indicated by a special marker, value, or appending bit to the item in the item buffer, in some embodiments. If the last character has been evaluated, then an indication as to whether the item matches the regular expression based on the output of the state detection states may be provided, as indicated at 938. For example, the output values of the state detection stages when the last character is evaluated may be compared as a result bit vector with a match vector, in which the if the result bit vector matches the match vector (or satisfies the criteria for match inclusive of don't-care values or differing combinations of state detection output values that match the match vector).

Figure 10:
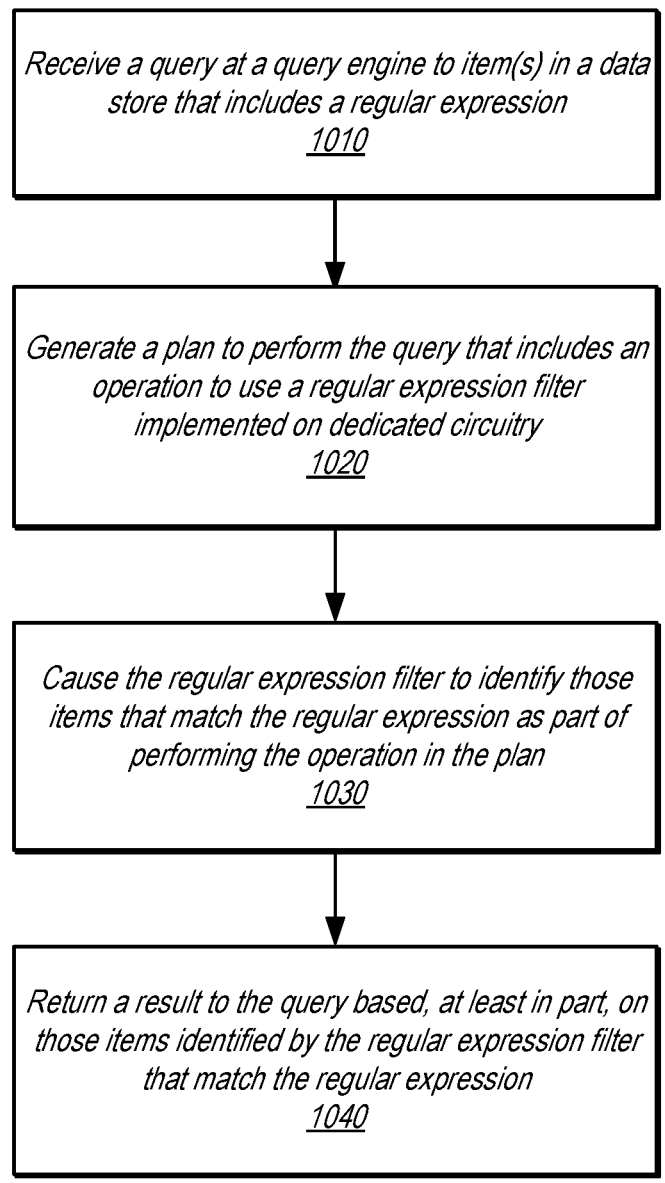
FIG. 10 is a high-level flowchart illustrating methods and techniques to implement utilizing a hardware accelerated regular expression filter at a query engine, according to some embodiments.

FIG. 10 is a high-level flowchart illustrating methods and techniques to implement utilizing a hardware accelerated regular expression filter at a query engine, according to some embodiments. As indicated at 1010, a query may be received at a query engine to item(s) in a data store that includes a regular expression. For example, as discussed above with regard to FIGS. 2-5, a data processing system or service, like a data warehouse, may implement a query engine to handle queries to a data store. In such scenarios, the query engine may be separately hosted from dedicated circuitry to implement a regular expression filter. In other embodiments, the dedicated circuitry may be hosted together at a same host (e.g., where the query engine is implemented on a CPU and FPGA implements the regular expression filter on a same server).

As indicated at 1020, a plan to perform the query may be generated that includes an operation to use a regular expression filter implemented on dedicated circuitry, in some embodiments. For example, the query may be parsed into a symbol or syntax tree. A query optimizer may then generate one or more query plans that include operations to perform the query, including operations to utilize a regular expression filter on dedicated circuitry.

As indicated at 1030, the regular expression filter may be caused to identify those items that match the regular expression as part of performing the operation in the plan, in some embodiments. For instance, to perform the operation, a network request may be sent to a host system for the dedicated circuitry which could parse the request, program the regular expression filter on the dedicated circuitry, and instruct the regular expression filter to identify items that match the regular expression. In other embodiments, performing the operation may include the query engine (or other local application) programming a local regular expression filter and instructing the local regular expression filter to identify items that match the regular expression.

As indicated at 1040, a result to the query may be returned based, at least in part, on those items identified by the regular expression filter that match the regular expression, in some embodiments. For example, a stream of items that match the regular expression may be returned from the regular expression filter (over the network or via a local interconnect) with the non-matching items removed from the stream of items.

The methods described herein may in various embodiments be implemented by any combination of hardware and software. For example, in one embodiment, the methods may be implemented by a computer system (e.g., a computer system as in FIG. 11) that includes one or more processors executing program instructions stored on a computer-readable storage medium coupled to the processors. The program instructions may implement the functionality described herein (e.g., the functionality of various servers and other components that implement the network-based virtual computing resource provider described herein). The various methods as illustrated in the figures and described herein represent example embodiments of methods. The order of any method may be changed, and various elements may be added, reordered, combined, omitted, modified, etc.

Embodiments of sharing character data across lookups in a regular expression filter to identify matches to a regular expression as described herein may be executed on one or more computer systems, which may interact with various other devices. One such computer system is illustrated by FIG. 11. In different embodiments, computer system 2000 may be any of various types of devices, including, but not limited to, a personal computer system, desktop computer, laptop, notebook, or netbook computer, mainframe computer system, handheld computer, workstation, network computer, a camera, a set top box, a mobile device, a consumer device, video game console, handheld video game device, application server, storage device, a peripheral device such as a switch, modem, router, or in general any type of computing node, compute node, computing device, compute device, or electronic device.

In the illustrated embodiment, computer system 2000 includes one or more processors 2010 coupled to a system memory 2020 via an input/output (I/O) interface 2030. Computer system 2000 further includes a network interface 2040 coupled to I/O interface 2030, and one or more input/output devices 2050, such as cursor control device 2060, keyboard 2070, and display(s) 2080. Display(s) 2080 may include standard computer monitor(s) and/or other display systems, technologies or devices. In at least some implementations, the input/output devices 2050 may also include a touch- or multi-touch enabled device such as a pad or tablet via which a user enters input via a stylus-type device and/or one or more digits. In some embodiments, it is contemplated that embodiments may be implemented using a single instance of computer system 2000, while in other embodiments multiple such systems, or multiple nodes making up computer system 2000, may host different portions or instances of embodiments. For example, in one embodiment some elements may be implemented via one or more nodes of computer system 2000 that are distinct from those nodes implementing other elements.

In various embodiments, computer system 2000 may be a uniprocessor system including one processor 2010, or a multiprocessor system including several processors 2010 (e.g., two, four, eight, or another suitable number). Processors 2010 may be any suitable processor capable of executing instructions. For example, in various embodiments, processors 2010 may be general-purpose or embedded processors implementing any of a variety of instruction set architectures (ISAs), such as the x86, PowerPC, SPARC, or MIPS ISAs, or any other suitable ISA. In multiprocessor systems, each of processors 2010 may commonly, but not necessarily, implement the same ISA.

In some embodiments, at least one processor 2010 may be a graphics processing unit. A graphics processing unit or GPU may be considered a dedicated graphics-rendering device for a personal computer, workstation, game console or other computing or electronic device. Modern GPUs may be very efficient at manipulating and displaying computer graphics, and their highly parallel structure may make them more effective than typical CPUs for a range of complex graphical algorithms. For example, a graphics processor may implement a number of graphics primitive operations in a way that makes executing them much faster than drawing directly to the screen with a host central processing unit (CPU). In various embodiments, graphics rendering may, at least in part, be implemented by program instructions that execute on one of, or parallel execution on two or more of, such GPUs. The GPU(s) may implement one or more application programmer interfaces (APIs) that permit programmers to invoke the functionality of the GPU(s). Suitable GPUs may be commercially available from vendors such as NVIDIA Corporation, ATI Technologies (AMD), and others.

System memory 2020 may store program instructions and/or data accessible by processor 2010. In various embodiments, system memory 2020 may be implemented using any suitable memory technology, such as static random access memory (SRAM), synchronous dynamic RAM (SDRAM), nonvolatile/Flash-type memory, or any other type of memory. In the illustrated embodiment, program instructions and data implementing desired functions, such as those described above are shown stored within system memory 2020 as program instructions 2025 and data storage 2035, respectively. In other embodiments, program instructions and/or data may be received, sent or stored upon different types of computer-accessible media or on similar media separate from system memory 2020 or computer system 2000. Generally speaking, a non-transitory, computer-readable storage medium may include storage media or memory media such as magnetic or optical media, e.g., disk or CD/DVD-ROM coupled to computer system 2000 via I/O interface 2030. Program instructions and data stored via a computer-readable medium may be transmitted by transmission media or signals such as electrical, electromagnetic, or digital signals, which may be conveyed via a communication medium such as a network and/or a wireless link, such as may be implemented via network interface 2040.

In one embodiment, I/O interface 2030 may coordinate I/O traffic between processor 2010, system memory 2020, and any peripheral devices in the device, including network interface 2040 or other peripheral interfaces, such as input/output devices 2050. In some embodiments, I/O interface 2030 may perform any necessary protocol, timing or other data transformations to convert data signals from one component (e.g., system memory 2020) into a format suitable for use by another component (e.g., processor 2010). In some embodiments, I/O interface 2030 may include support for devices attached through various types of peripheral buses, such as a variant of the Peripheral Component Interconnect (PCI) bus standard or the Universal Serial Bus (USB) standard, for example. In some embodiments, the function of I/O interface 2030 may be split into two or more separate components, such as a north bridge and a south bridge, for example. In addition, in some embodiments some or all of the functionality of I/O interface 2030, such as an interface to system memory 2020, may be incorporated directly into processor 2010.

Network interface 2040 may allow data to be exchanged between computer system 2000 and other devices attached to a network, such as other computer systems, or between nodes of computer system 2000. In various embodiments, network interface 2040 may support communication via wired or wireless general data networks, such as any suitable type of Ethernet network, for example; via telecommunications/telephony networks such as analog voice networks or digital fiber communications networks; via storage area networks such as Fibre Channel SANs, or via any other suitable type of network and/or protocol.

Input/output devices 2050 may, in some embodiments, include one or more display terminals, keyboards, keypads, touchpads, scanning devices, voice or optical recognition devices, or any other devices suitable for entering or retrieving data by one or more computer system 2000. Multiple input/output devices 2050 may be present in computer system 2000 or may be distributed on various nodes of computer system 2000. In some embodiments, similar input/output devices may be separate from computer system 2000 and may interact with one or more nodes of computer system 2000 through a wired or wireless connection, such as over network interface 2040.

As shown in FIG. 11, memory 2020 may include program instructions 2025, that implement the various methods and techniques as described herein, and data storage 2035, comprising various data accessible by program instructions 2025. In one embodiment, program instructions 2025 may include software elements of embodiments as described herein and as illustrated in the Figures. Data storage 2035 may include data that may be used in embodiments. In other embodiments, other or different software elements and data may be included.

Those skilled in the art will appreciate that computer system 2000 is merely illustrative and is not intended to limit the scope of the techniques as described herein. In particular, the computer system and devices may include any combination of hardware or software that can perform the indicated functions, including a computer, personal computer system, desktop computer, laptop, notebook, or netbook computer, mainframe computer system, handheld computer, workstation, network computer, a camera, a set top box, a mobile device, network device, internet appliance, PDA, wireless phones, pagers, a consumer device, video game console, handheld video game device, application server, storage device, a peripheral device such as a switch, modem, router, or in general any type of computing or electronic device. Computer system 2000 may also be connected to other devices that are not illustrated, or instead may operate as a stand-alone system. In addition, the functionality provided by the illustrated components may in some embodiments be combined in fewer components or distributed in additional components. Similarly, in some embodiments, the functionality of some of the illustrated components may not be provided and/or other additional functionality may be available.

Those skilled in the art will also appreciate that, while various items are illustrated as being stored in memory or on storage while being used, these items or portions of them may be transferred between memory and other storage devices for purposes of memory management and data integrity. Alternatively, in other embodiments some or all of the software components may execute in memory on another device and communicate with the illustrated computer system via inter-computer communication. Some or all of the system components or data structures may also be stored (e.g., as instructions or structured data) on a computer-accessible medium or a portable article to be read by an appropriate drive, various examples of which are described above. In some embodiments, instructions stored on a non-transitory, computer-accessible medium separate from computer system 2000 may be transmitted to computer system 2000 via transmission media or signals such as electrical, electromagnetic, or digital signals, conveyed via a communication medium such as a network and/or a wireless link. Various embodiments may further include receiving, sending or storing instructions and/or data implemented in accordance with the foregoing description upon a computer-accessible medium. Accordingly, the present invention may be practiced with other computer system configurations.

It is noted that any of the distributed system embodiments described herein, or any of their components, may be implemented as one or more web services. In some embodiments, a network-based service may be implemented by a software and/or hardware system designed to support interoperable machine-to-machine interaction over a network. A network-based service may have an interface described in a machine-processable format, such as the Web Services Description Language (WSDL). Other systems may interact with the web service in a manner prescribed by the description of the network-based service's interface. For example, the network-based service may define various operations that other systems may invoke, and may define a particular application programming interface (API) to which other systems may be expected to conform when requesting the various operations.

In various embodiments, a network-based service may be requested or invoked through the use of a message that includes parameters and/or data associated with the network-based services request. Such a message may be formatted according to a particular markup language such as Extensible Markup Language (XML), and/or may be encapsulated using a protocol such as Simple Object Access Protocol (SOAP). To perform a web services request, a network-based services client may assemble a message including the request and convey the message to an addressable endpoint (e.g., a Uniform Resource Locator (URL)) corresponding to the web service, using an Internet-based application layer transfer protocol such as Hypertext Transfer Protocol (HTTP).

In some embodiments, web services may be implemented using Representational State Transfer ("RESTful") techniques rather than message-based techniques. For example, a web service implemented according to a RESTful technique may be invoked through parameters included within an HTTP method such as PUT, GET, or DELETE, rather than encapsulated within a SOAP message.

The various methods as illustrated in the FIGS. and described herein represent example embodiments of methods. The methods may be implemented in software, hardware, or a combination thereof. The order of method may be changed, and various elements may be added, reordered, combined, omitted, modified, etc.

Various modifications and changes may be made as would be obvious to a person skilled in the art having the benefit of this disclosure. It is intended that the invention embrace all such modifications and changes and, accordingly, the above description to be regarded in an illustrative rather than a restrictive sense.

What is claimed is:

1. A method, comprising:
   responsive to a query to one or more items of a data store that includes a regular expression:
      programming, by a controller for a regular expression filter, a plurality of nondeterministic finite automaton (NFA) states identified for evaluating a stream of characters from the one or more items in the data store with respect to the regular expression, wherein the NFA states each comprise a respective character decode stage and a respective state detection stage, and wherein the respective state detection stages collectively share a register storing portions of individual ones of the stream of characters;
      processing, by dedicated circuitry that implements the regular expression filter, the one or more items retrieved from the data store as a stream of individual characters, each individual character comprising a first set of bits including a plurality of least significant bits and a second set of bits including one or more most significant bits not included in the first set of bits, through the NFA states to identify those items of the one or more items that match the regular expression, comprising:
         evaluating, at the respective character decode stages of the NFA states, the first set of bits of each of the individual characters to determine respective output values for the character decode stages;
         evaluating, at the respective state detection stages of the NFA states, the second set of bits of each of the individual characters obtained from the shared register and respective output values of the respective decode stages of the NFA states to determine respective output values for the respective state detections stages; and
         after evaluating a last character of each of the one or more items at the NFA states, indicating whether each of the one or more items matches the regular expression based on the respective output values of the respective state detection stages of the NFA states.

2. The method of claim 1, further comprising:
   receiving at a host implementing the controller for the regular expression filter at least one of the items in the data store received from the regular expression filter and identified as matching the regular expression; and
   providing, by the host, the at least one item for inclusion in a result of the query.

3. The method of claim 1,
   wherein processing the one or more items retrieved from the data store as the stream of individual characters through the NFA states further comprises:
      obtaining the stream of characters of the one or more items from a buffer that stores the one or more items; and
      re-mapping the stream of characters before evaluating the first set of bits of each of the individual characters at the character decode stage and the second set of bits of each of the individual characters at the state detection stage.

4. The method of claim 1, further comprising:
   receiving the query that includes the regular expression at a query engine for the data store;
   generating a plan to perform the query that includes an operation to use the regular expression filter;
   causing the controller to perform the programming and the regular expression filter to perform the processing as part of performing the plan; and
   returning a result to the query based, at least in part, on at least one item identified by the regular expression filter as matching the regular expression.

5. The method of claim 4, wherein causing the controller to perform the programming and the regular expression filter to perform the processing comprises sending an instruction to the controller via a local interconnect at a system that implements the query engine, controller, and dedicated circuitry that implements the regular expression filter.

6. The method of claim 4, wherein causing the controller to perform the programming and the regular expression filter to perform the processing comprises sending a request via a network to a separate system that implements the query engine, controller, and dedicated circuitry that implements the regular expression filter.

7. The method of claim 1, wherein programming the NFA states identified for evaluating the stream of characters from the one or more items in the data store with respect to the regular expression comprises:
   determining the NFA states of the regular expression; and
   determining lookup values for the character decode stage and the state detection stage of each of the NFA states; and
   causing the lookup values to be stored at the regular expression filter for processing the one or more items through the NFA states of the regular expression filter.

8. The method of claim 1, further comprising:
   responsive to a second query that includes a different regular expression:
      programming, by the controller, a second plurality of NFA states of the regular expression filter identified for evaluating items in the data store with respect to the second regular expression, wherein a number of NFA states of the second plurality of NFA states is different than a number of NFA states of the plurality of NFA states.

9. The method of claim 1, wherein the regular expression includes a Kleene closure.

10. A system, comprising:
    at least one processor;
    a memory, storing program instructions that cause the at least one processor to implement a controller for an analytics filter;
    one or more integrated circuits, configured to implement the analytics filter, the analytics filter comprising a plurality of nondeterministic finite automaton (NFA) states, wherein the NFA states each comprise a respective character decode stage and a respective state detection stage;
    a shared register storing portions of individual ones of a stream of characters for the respective state detection stages of the plurality of NFA states;
    the controller, configured to:
        responsive to a request to filter one or more items in a data store with respect to a regular expression:
            program the NFA states to evaluate a stream of individual characters from the one or more items in the data store with respect to the regular expression, wherein each of the individual characters comprises a first set of bits including a plurality of bits and a second set of bits including one or more bits not included in the first set of bits; and
            cause the analytics filter to:
                evaluate, at the respective character decode stages of the NFA states, the first set of bits of each of the individual characters to determine respective output values for the character decode stages;
                evaluate, at the respective state detection stages of the NFA states, the second set of bits of each of the individual characters obtained from the shared register and respective output values of the respective decode stages of the NFA states to determine respective output values for the respective state detections stages; and
                after evaluating a last character of each of the one or more items at the NFA states, indicate whether each of the one or more items matches the regular expression based on the respective output values of the respective state detection stages of the NFA states.

11. The system of claim 10, wherein the at least one processor, the memory, and the one or more integrated circuits are hosted at a processing node, and wherein the processing node is configured to:
    receive at least one of the items in the data store received from the regular expression filter and identified as matching the regular expression; and
    provide the at least one item for inclusion in a result of the query.

12. The system of claim 10, wherein the analytics filter further comprises a character re-mapper that re-maps the stream of characters before the evaluation of the first set of bits of the characters at the character decode stage and the second set of bits at the state detection stage.

13. The system of claim 10, wherein the one or more integrated circuits are further configured to implement one or more analytics filters in addition to the analytics filter, wherein at least one of the other analytics filters is another regular expression filter.

14. The system of claim 10, wherein the controller is further configured to:
    responsive to a second request to filter items in the data store with respect to a second regular expression, program a second plurality of NFA states in the analytics filter to evaluate items in the data store with respect to the second regular expression, wherein a number of NFA states of the second plurality of NFA states is different than a number of NFA states of the plurality of NFA states.

15. The system of claim 10, wherein the at least one processor, the memory, and the one or more integrated circuits are hosted at an analytics processing node, wherein the system further comprises one or more data processing nodes that implement a query engine, and wherein the query engine is configured to:
    receive the query that includes the regular expression at a query engine for the data store;
    generate a plan to perform the query that includes an operation to use the analytics processing node;
    cause the controller to perform the programming and the regular expression filter to perform the processing as part of performing the plan; and
    return a result to the query based, at least in part, on at least one item identified by the analytics filter as matching the regular expression.

16. The system of claim 15, wherein the one or more data processing nodes are implemented as part of a data warehouse service of a provider network and wherein the analytics processing nodes is implemented as part of a hardware accelerated data analytics service of the provider network.

17. The system of claim 10, wherein the analytics filter of the one or more integrated circuits is configured to implement a regular expression filter, the regular expression filter comprising:
    a buffer, configured to store a tuple from a stream of tuples received from the data store and processed through the regular expression filter;
    the shared register that stores a second set of bits of a character of a tuple stored in the buffer and processed through the regular expression filter;
    the plurality of nondeterministic finite automaton (NFA) stages that process individual characters of the tuple stored in the buffer to determine whether the tuple matches the regular expression, wherein the NFA stages are programmed responsive to the request to filter one or more items in the data store with respect to the regular expression, and wherein the NFA stages each comprise:
        one of the respective character decode stages, configured to decode a first set of bits of the character of the tuple to determine an output value for the character decode stage;
        one of the respective state detection stages, configured to determine an output value for the respective state detection stage based, at least in part, on:
            the output value of the respective character decode stage; and
            the second set of bits of the character obtained from the shared register; and
    an acceptor, programmed responsive to the request to filter the one or more items in the data store with respect to the regular expression, and wherein the acceptor is configured to indicate whether the tuple matches the regular expression based on the determined output values of the NFA stages after a last character of the tuple is evaluated at the NFA stages.

18. The system of claim 17, wherein the regular expression further comprises a character re-mapper that maps a character obtained from the buffer to a re-mapped character, wherein the character re-mapper is programmed responsive to the request to filter the one or more items in the data store with respect to the regular expression, wherein the second set of bits of the character stored in the shared register are one or more bits of the re-mapped character, wherein the first set of bits of the character decoded at the character decode stage are bits of the re-mapped character, and wherein the regular expression includes a character class.

19. The system of claim 17, wherein the respective state detection stage is configured to determine the output value for the respective state detection stage further based on a jump indication input, and wherein the regular expression includes an alternation.

20. The system of claim 10, wherein the one or more integrated circuits are implemented on a Field Programmable Gate Array (FPGA), Application Specific Integrated Circuit (ASIC), or System-on-a-Chip (SoC).

* * * * *